United States Patent
Luo et al.

(10) Patent No.: US 10,693,483 B1
(45) Date of Patent: Jun. 23, 2020

(54) ADAPTIVE TOGGLE NUMBER COMPENSATION FOR REDUCING DATA DEPENDENT SUPPLY NOISE IN DIGITAL-TO-ANALOG CONVERTERS

(71) Applicant: Analog Devices International Unlimited Company, Limerick (IE)

(72) Inventors: Hao Luo, Hangzhou (CN); Shawn S. Kuo, Arlington, MA (US); Jialin Zhao, Beijing (CN); Steven Rose, Woburn, MA (US); Dong Li, Jingyang (CN); Lin Zhang, Beijing (CN); Tommi Wang, Beijing (CN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/542,602

(22) Filed: Aug. 16, 2019

(51) Int. Cl.
  *H03M 1/08* (2006.01)
  *H03M 3/00* (2006.01)
  *H03M 1/68* (2006.01)

(52) U.S. Cl.
  CPC ......... *H03M 1/0836* (2013.01); *H03M 1/687* (2013.01); *H03M 3/326* (2013.01); *H03M 3/502* (2013.01)

(58) Field of Classification Search
  CPC .... H03M 1/687; H03M 1/0836; H03M 3/502; H03M 3/326
  USPC .......................................... 341/118, 143–145
  See application file for complete search history.

(56) References Cited

U.S. PATENT DOCUMENTS

| | | | |
|---|---|---|---|
| 4,947,169 A | 8/1990 | Smith et al. | |
| 6,344,816 B1 | 2/2002 | Dedic | |
| 6,774,830 B2 | 10/2004 | Brooks | |
| 6,844,835 B2 | 1/2005 | Kao | |
| 7,205,920 B2 | 4/2007 | Morrow et al. | |
| 8,816,889 B2 * | 8/2014 | Teterwak ............ | H03M 1/0678 341/144 |

(Continued)

FOREIGN PATENT DOCUMENTS

EP    2062363    4/2008

OTHER PUBLICATIONS

Spiridon et al., *A Linearity Improvement Technique for Overcoming Signal-Dependent Induced Switching Time Mismatch in DAC-Based Transmitters*, 978-104673-7472-9 © 2015, 4 pages.

Primary Examiner — Khai M Nguyen
(74) Attorney, Agent, or Firm — Patent Capital Group

(57) ABSTRACT

Adaptive toggle number compensation techniques for reducing data dependent supply noise in DACs are disclosed. Various embodiments are based on setting a certain target toggle number for a plurality of DAC units used to convert at least a portion of a digital data sample and then applying various adaptive techniques to try to achieve the target toggle number in converting the data sample from digital to analog domain. Adaptive toggle number compensation techniques described herein try to reduce data dependent supply noise by deliberately limiting, to a certain target number, the number of DAC units that undergo a switch from the digital input of 1 to 0 or from 0 to 1 in converting a digital data sample. Compared to the conventional dummy signal generation approach, such adaptive toggle number compensation techniques may provide significant savings in terms of power consumption of a DAC.

20 Claims, 9 Drawing Sheets

(56) References Cited

U.S. PATENT DOCUMENTS

| | | |
|---|---|---|
| 9,124,287 B1 | 9/2015 | Ho et al. |
| 9,716,508 B1 | 7/2017 | Zhang |
| 9,800,254 B2 * | 10/2017 | Chandra ............ H03M 1/0624 |
| 2004/0036636 A1 | 2/2004 | Mai et al. |

* cited by examiner

US 10,693,483 B1

ADAPTIVE TOGGLE NUMBER COMPENSATION FOR REDUCING DATA DEPENDENT SUPPLY NOISE IN DIGITAL-TO-ANALOG CONVERTERS

CROSS-REFERENCE TO RELATED APPLICATIONS

This application claims the benefit of and priority from PCT Application No. PCT/CN2019/093689 filed 28 Jun. 2019, entitled "ADAPTIVE TOGGLE NUMBER COMPENSATION FOR REDUCING DATA DEPENDENT SUPPLY NOISE IN DIGITAL-TO-ANALOG CONVERTERS", incorporated herein by reference in its entirety.

TECHNICAL FIELD OF THE DISCLOSURE

The present disclosure relates generally to digital-to-analog converters (DACs) and, more particularly, to methods and systems for reducing data dependent supply noise in DACs.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are DACs, and their outputs are used to drive a variety of devices. Radio frequency (RF) transmitters, loudspeakers, video displays, motors, mechanical servos, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

In theory, a DAC can operate at any frequency to provide an analog output corresponding to the digital data input. However, in the real world, errors and noise occur throughout the system, the effects of which increase with operating frequency. These effects may be code dependent and may result in harmonic distortion and harmonic spurs in the analog output signal. Improvements could be made with respect to addressing this issue.

BRIEF DESCRIPTION OF THE DRAWINGS

To provide a more complete understanding of the present disclosure and features and advantages thereof, reference is made to the following description, taken in conjunction with the accompanying FIGS., wherein like reference numerals represent like parts, in which.

DESCRIPTION OF EXAMPLE EMBODIMENTS OF THE DISCLOSURE

Overview

Figure 1:
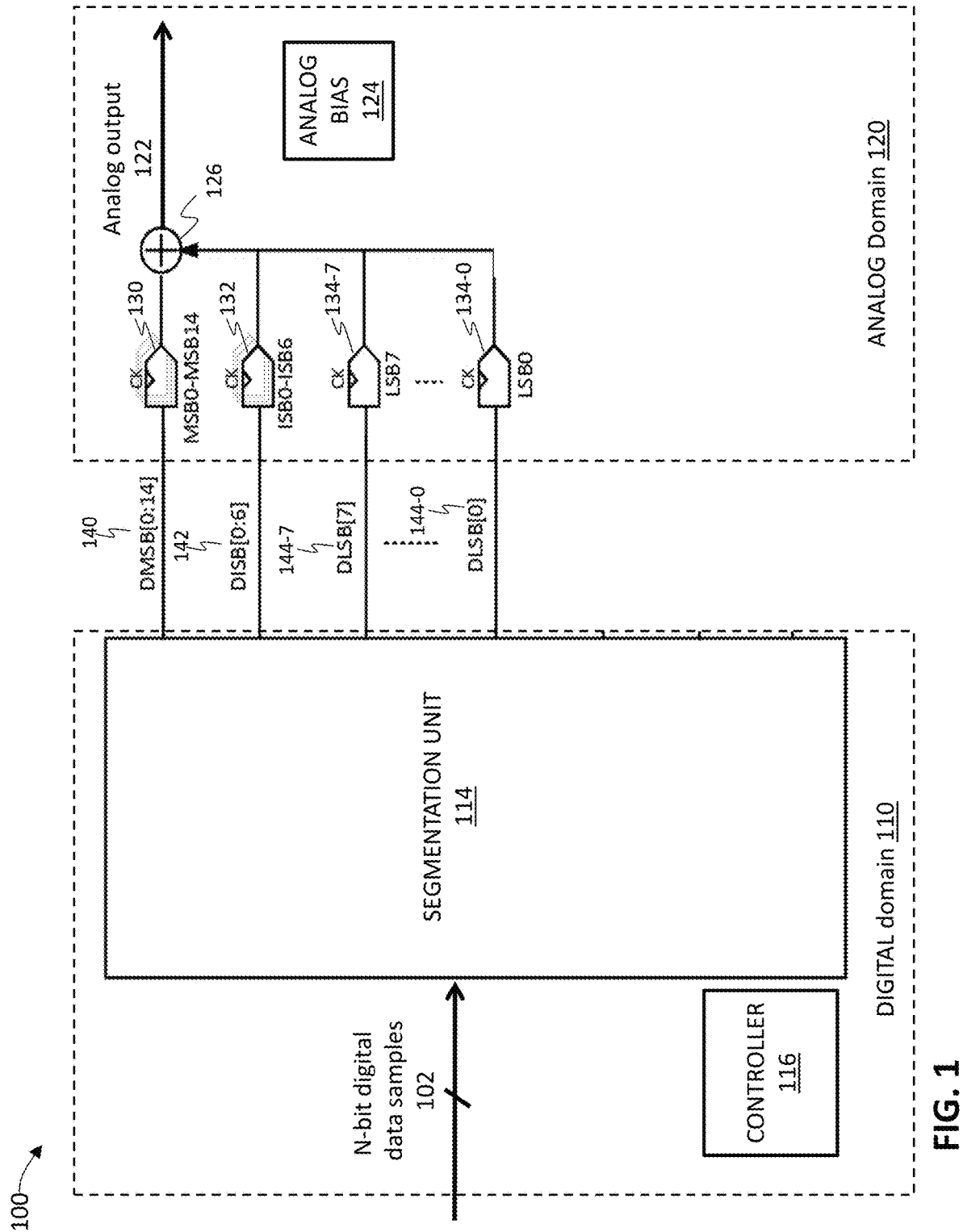
FIG. 1 provides a schematic illustration of an example segmented DAC system, according to some embodiments of the disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating methods and systems for reducing supply modulation in DACs, proposed herein, it might be useful to first understand phenomena that may come into play in such systems. The following foundational information may be viewed as a basis from which the present disclosure may be properly explained. Such information is offered for purposes of explanation only and, accordingly, should not be construed in any way to limit the broad scope of the present disclosure and its potential applications.

A DAC is a device that produces a quantized (discrete step) analog output in response to a binary digital input code. The digital input signal may be e.g. input from transistor logic, emitter-coupled logic, complementary metal-oxide-semiconductor circuits, low-voltage differential signaling, a high-speed interface such as e.g. JESD204, while the analog output signal may be either a voltage or a current. To generate the output, a reference quantity (either a voltage or a current) may be divided into binary and/or linear fractions. The digital input may then drive switches to individual DAC units, which could comprise current sources, voltage sources, resistors, capacitors, etc., that combine an appropriate number of these fractions to produce the output. The number and size of the fractions, as well as the type of encoding used, reflect the number of possible digital input codes, which is a function of converter resolution or the number of bits (N) in the digital input code. For example, N bits could result in $2^N$ possible codes.

As used herein, the term "DAC unit," sometimes also referred to as a "DAC cell," refers to an analog element such as a current source or a switched capacitor element that delivers an analog quantity such as charge or current. For example, in context of a current-steering DAC, a DAC unit may comprise a DAC element that includes two current sources, e.g. a p-type metal-oxide-semiconductor (P-MOS) and an n-type metal-oxide-semiconductor (N-MOS) current sources, as well as switching mechanisms associated with each of the two current sources. In another example, a DAC unit may be an element that can deliver a charge Q equal to the product of a pre-defined reference voltage Vref and a capacitance C. The polarity of this charge is defined by the digital input to the DAC unit.

Designing an optimum DAC is not trivial. Analog signals are continuous time-domain signals with infinite resolution and possibly infinite bandwidth. However, an analog output of a DAC is a signal constructed from discrete, quantized, values generated at uniform, but finite, sampling time intervals. In other words, an output of a DAC attempts to represent an analog signal with a signal that features finite resolution and finite bandwidth. Quantization and sampling impose fundamental and predictable limits on DAC's performance. For example, quantization may set the maximum dynamic range of a DAC and causes quantization error, or noise, in the output of a DAC, while sampling may set the maximum bandwidth of a DAC's output signal according to Nyquist criteria. In addition, operation of a DAC may be affected by non-ideal effects beyond those dictated by quantization and sampling. One such effect is creation of data dependent supply noise where different DAC input data patterns will provide different data dependent interference to DAC's analog output through many different schemes. Such data dependent interference is treated as noise with respect to the desired analog output signal. In one example of a data dependent interference scheme, different digital data patterns inject different noise into power or ground of a DAC. This noise is then added to final DAC analog output through related DAC units. In another example of a data dependent interference scheme, different digital data patterns affect the quality of the clock signals used to sample or latch related data for synchronization proposes. This noise is also added to the final DAC analog output through related DAC units.

Methods for addressing data dependent supply noise problems as described above exist in prior art. One such method involves generating an additional digital signal to complement, or balance, a digital data signal to be converted by a given DAC unit in that, at each clock cycle, there will be a data toggle either in the digital data signal or in the additional digital signal, where "toggle" refers to the change in the digital input values from 0 to 1 or from 1 to 0. Providing both of such signals to a DAC unit results in the DAC unit converting a uniform pattern comprising alternating 1's and 0's. The output of the DAC unit resulting from the conversion of the bits of the additional digital signal is not used in any way, resulting in a name "dummy signal" being given to such an additional digital signal. Such an approach is described, e.g., in U.S. Pat. No. 6,344,816 (referred to in the following as the "'816 patent") that describes adding an additional clocked circuit called a "dummy latch" in parallel with the main DAC circuit called an "output latch." The output of the dummy latch is not itself used in any way, rather the dummy latch and the output latch are connected and operated such that with every cycle of the clocking signal, one of the latches will change state and the other will not. Thus, if the output latch changes state with the data signal, the dummy latch maintains its logic state, and if the output latch maintains its logic state constant with an unchanging data signal, then the dummy latch will change logic states. According to the '816 patent, this arrangement can maintain a constant loading on the clocking signal that is independent of the data signal logic state, thereby reducing or eliminating data dependent supply noise in DAC's output.

While the approach described above may provide improvements in terms of reducing data dependent supply noise, implementing such an approach is associated with relatively high power consumption. As a result, the approach described above may not be suitable for certain applications where limiting power consumption is critical. One prominent example of such applications are battery-operated devices, e.g., mobile applications where DACs may be used in RF components and products such as cell phones.

Present disclosure relates to systems and methods implementing adaptive toggle number compensation techniques for reducing data dependent noise (e.g., due to supply modulation) in DACs in a manner that may provide an improvement on at least some of the challenges described above. Various embodiments are based on setting a certain target toggle number for a plurality of DAC units used to convert at least a portion of a digital data sample and then applying various adaptive techniques to try to achieve the target toggle number in converting the data sample from digital to analog domain. In this context, the term "toggle number" refers to the number of DAC units, of said plurality of DAC units, for which the digital input value changes from 0 to 1 or from 1 to 0 between conversion of the last digital data sample (denoted as "$S_{n-1}$", where n is an integer equal to or greater than 1) and the current digital data sample (denoted as "$S_n$"). In other words, the term "toggle number" refers to the number of DAC units, of said plurality of DAC units, for which the digital input value changes from 0 to 1 or from 1 to 0 between conversion of the current data sample (which may also be referred to as "the next data sample") and conversion of the digital data sample (which may be referred to as "the last data sample") that immediately preceded the current data sample. Because techniques or mechanisms, including circuits, methods, and processing logic, described herein involve implementing some kind of adaptive compensation to achieve the target toggle number, these techniques may be referred to as "adaptive toggle number compensation" techniques. One adaptive toggle number compensation technique described herein includes modifying the current data sample and using additional DAC units to compensate for the modification, e.g., as illustrated below with reference to transparent ISB dither with adaptive toggle compensation. Another adaptive toggle number compensation technique described herein includes carefully selecting which DAC units are to be used for the conversion of the current data sample, e.g., as illustrated below with reference to toggle-controllable MSB shuffle. A third toggle number compensation technique described herein includes adding some extra DAC units and providing a modified version of a dummy signal to them, e.g., as illustrated below with reference to dummy toggle generation. In various embodiments, any of these adaptive toggle number compensation techniques may be used either alone or in any combination of two or more of the techniques.

Compared to the conventional dummy signal generation approach described above, various adaptive toggle number compensation techniques may provide significant savings in terms of power consumption of a DAC configured to reduce data dependent supply noise. In the conventional dummy signal generation approach described above, the number of toggle switches is maximized because each DAC unit is always configured to convert a uniform pattern comprising alternating 1's and 0's. Thus, for a given number of DAC units that may be used to convert digital data samples of a certain resolution (e.g., of a certain number of bits), the toggle number for converting each new digital data sample is always equal to the number of DAC units (again, because each DAC unit is intentionally configured to switch to transfer an alternating series of 1's and 0's). In sharp contrast to such a conventional approach that focuses on operation of individual DAC units in an attempt to reduce data dependent noise, various techniques described herein consider a plurality of DAC units as a whole. In particular, various adaptive toggle number compensation techniques described herein try to reduce data dependent supply noise by deliberately limiting, to a certain target number, the number of DAC units that undergo a switch from the digital input of 1 to 0 or from 0 to 1 in converting a digital data sample (i.e., the target toggle number is intentionally made smaller than the total number of DAC units that may be used for the conversion). To that end, ingenious toggle number compensation techniques provided herein attempt to ensure that the target toggle number is achieved. By trying to maintain a certain target toggle number in converting at least portions of at least some digital data samples, data dependent supply noise of a DAC may be reduced. By limiting the number of DAC units that undergo a switch from the digital input of 1 to 0 or from 0 to 1 in converting a new digital data sample, power savings may be achieved, compared to the conventional dummy signal generation approach described above. Moreover, with the conventional dummy signal generation approach each DAC unit requires a corresponding dummy DAC unit to compensate its toggle. Thus, the number of dummy DAC units has to be the same as that of the regular DAC units. As a result, the loading of the DAC clock path and data path is doubled, and the power consumption is largely increased. Various adaptive toggle number compensation techniques described herein either do not need dummy DAC units at all, or only need a small number of dummy DAC units to provide a modified version of a dummy signal (as illustrated below with reference to dummy toggle generation), so the power consumption may be significantly reduced.

It should be noted that descriptions provided herein that refer to the digital input values of 1s and/or 0s for various DAC units (e.g., descriptions that refer to the digital input values to a given DAC unit switching from 0 to 1 or from 1 to 0 in conversion of consecutive digital samples) are applicable to more general embodiments where the DAC units receive one of two different control signals that configure the DAC units to operate in one of two states, all of which embodiments being within the scope of the present disclosure. Thus, in general, a DAC unit described to receive, convert, or transfer (which three terms may be used interchangeably) a digital value of 1 may refer to a DAC unit that receives a first control signal that configures the DAC unit to operate in a first state of the two states, to generate a first output. On the other hand, in general, a DAC unit described to receive, convert, or transfer a digital value of 0 may refer to a DAC unit that receives a second control signal, different from the first control signal, that configures the DAC unit to operate in a second state of the two states, the second state being different from the first state, to generate a second output. The first output of such a DAC unit (i.e., the output produced when the DAC unit operates in the first state) is different from the second output of the DAC unit (i.e., the output produced when the DAC unit operates in the second state). In some embodiments, one control signal of the first control signal and the second control signal may be provided in a form of a bit of 1 (or a high logic state) and another control signal of the first control signal and the second control signal may be provided in a form of a bit of 0 (or a low logic state). In some embodiments, a DAC unit operating in the first state may include conducting current to the output of the DAC unit if the DAC unit is a single-ended DAC unit, or may include conducting current to the positive output of the DAC unit if the DAC unit is a differential DAC unit. In some embodiments, a DAC unit operating in the second state may include not conducting current to the output of the DAC unit if the DAC unit is a single-ended DAC unit, or may include conducting current to the negative output of the DAC unit if the DAC unit is a differential DAC unit.

It should also be noted that descriptions provided herein may refer to trying to get a toggle number to be "equal to" a certain target toggle number. Such descriptions are to be understood that the target toggle number may not always be achieved and that getting relatively close to the target toggle number, e.g., within ±1 toggle, or within ±2-3 toggles, may be acceptable and within the scope of the present disclosure. For example, in some embodiments, the target toggle number may be achieved for the conversion of some digital samples of the digital input signal, but not the others. In such embodiments, having a toggle number being equal to the target toggle number may refer to having an average toggle number (i.e., the toggle number averaged from the conversion of a plurality of digital samples) being equal to the target toggle number. In some implementations, due to the limitations of toggle adjustable range, there may be some errors at some samples as compared to the target toggle number. However, such errors are expected to be small enough so that they would not significantly impact the performance. The exact value of toggle number error that can be tolerated may be dependent on the details of a particular implementation. Furthermore, in some implementations, the inclusion of the dummy toggle path as described herein may increase the toggle error tolerance of the MSB shuffle and the ISB dither proposed herein.

As will be appreciated by one skilled in the art, aspects of the present disclosure, in particular aspects of adaptive toggle number compensation techniques (e.g., one or more of transparent ISB dither, MSB shuffle, and dummy toggle generation) for reducing data dependent supply noise in DACs, as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "arrangement," "module," or "system." As least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing DACs, various electronic components or devices that include DACs, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Segmented DACs

Segmented architectures, where the full resolution of a converter is spread across two or more sub-DACs, can be used for both current- and voltage-output DACs. FIG. 1 illustrates an example segmented DAC system 100 according to some embodiments of the disclosure. The DAC system 100 may receive an N-bit digital data samples ("digital input") 102 and convert the received digital input into an analog output 122. The forward slash sign ("/") shown over the data path 102 in FIG. 1, as well as over some other data paths shown in the present figures, is used to indicate, as is typically used in the art, that data may be provided in parallel (e.g., such a data path may be a signal bus as opposed to a single signal). For example, for the data path of the digital input 102, this sign indicates that data representing different N-bit digital data samples or that data representing different portions of a given N-bit digital data sample may be provided in parallel, with portions of the complete data provided over the different paths.

In some embodiments, the DAC system 100 may be viewed as comprising a digital domain 110 and an analog domain 120. As shown in FIG. 1, in some embodiments, a segmentation unit (which may also be referred to as a "decoder") 114 configured to implement various coding functions (e.g., thermal coding, binary coding, and weighted coding) and controller 116 configured to control various aspects of the present disclosure may be, and usually are, implemented in the digital domain 110. On the other hand, in some embodiments, an analog bias circuit 124, an output adder 126, and various DAC units 130, 132, and 134 may be implemented in the analog domain 120.

The segmentation unit 114 may be configured to separate each of the N-bit digital samples/values of the digital input signal 102 into their M-bit MSB digital sample portion/value, I-bit ISB digital sample portion/value, and L-bit least significant bit (LSB) digital sample portion/value. Each of the M, I, and L may be an integer equal to or greater than zero and equal to or less than N, so that M+I+L=N. Digital signals 140, 142, and 144 may then be provided from the segmentation unit 114 to the respective DAC units 130, 132, and 134, where the digital signals 140, 142, and 144 indicate which DAC units are to be switched on (e.g., to transfer a value of 1) or off (e.g., to transfer a value of 0) for a conversion of a given digital data sample. The digital signals 140, 142, and 144 are indicative of the MSB digital sample values, the ISB digital sample values, and the LSB digital sample values, respectively, in that they configure the respective DAC units to transfer a value of 1 or 0, depending on which digital sample values are being converted. The MSB signals 140 are provided to the MSB DAC units 140, the ISB signals 142 are provided to the ISB DAC units 132, and the LSB signals 144 are provided to the LSB DAC units 144.

In some embodiments of the DAC system 100, each of the MSB and the ISB may be thermal-coded, while the LSB may be binary-coded (although, in other embodiments, coding may be different). In general, any of the MSB signal 140, the ISB signal 142, and the LSB signal 144 may be coded in any suitable manner, e.g., using any type of weighted and/or thermal coding.

In the example implementation where a certain K-bit digital sample (which may, e.g., be a portion of one of the digital samples of the digital input 102, e.g., the ISB portion) is thermal-coded, the segmentation unit 114 (e.g., a thermal coding element of the segmentation unit 114) may encode the K-bit digital sample into a $(2^K-1)$-bit thermal code which, in turn, may switch the corresponding individual $2^K-1$ Thermal DAC units on and off to convert the K-bit signal portion to an analog value. For example, if the MSB is thermal-coded, the segmentation unit 114 may encode an M-bit MSB value into a $(2^M-1)$-bit thermal code which is provided, in the MSB signal 140, to the MSB DAC units 130 ($2^M-1$ of the MSB DAC units 130) to switch the individual MSB DAC units 130 on and off to convert the M-bit MSB value or a portion of the digital value of the digital input signal 102 to an analog value. Example shown in FIG. 1 is for a 4-bit MSB (i.e., M=4), in which case the MSB signal 140 may include indications for each of 15 (15=$2^4$−1) MSB DAC units 130 as to whether each unit it to transfer a value of 1 or a 0 for the conversion of this M-bit MSB value. For example, the MSB signal 140 may include $2^M-1$ individual signals to respective individual MSB DAC units 130, with a one-to-one correspondence between one of the $2^M-1$ individual signals of the code signal 140 and a respective one of the $2^M-1$ MSB DAC units 130. In another example, if the ISB is thermal-coded, the segmentation unit 114 may encode an I-bit ISB value into a $(2^I-1)$-bit thermal code which is provided, in the ISB signal 142, to the ISB DAC units 132 ($2^I-1$ of the ISB DAC units 132) to switch the individual ISB DAC units 132 on and off to convert the I-bit ISB value or a portion of the digital value of the digital input signal 102 to an analog value. Example shown in FIG. 1 is for a 3-bit ISB (i.e., I=3), in which case the ISB signal 142 may include indications for each of 7 (7=2³−1) ISB DAC units 132 as to whether each unit it to transfer a value of 1 or a 0 for the conversion of this I-bit ISB value. For example, the ISB signal 142 may include $2^I-1$ individual signals to respective individual ISB DAC units 132, with a one-to-one correspondence between one of the $2^I-1$ individual signals of the code signal 142 and a respective one of the $2^I-1$ ISB DAC units 132.

In the example implementation where a certain digital sample (which may, e.g., be a portion of one of the digital samples of the digital input 102, e.g., the LSB portion) is binary-coded, the segmentation unit 114 (e.g., a binary coding element of the segmentation unit 114) may encode the K-bit digital sample into a K-bit binary code which, in turn, may switch the corresponding individual K binary DAC units on and off to convert the K-bit signal portion to an analog value. For example, if the LSB is binary-coded, the segmentation unit 114 may encode an L-bit LSB value into an L-bit binary code which is provided, in the LSB signal 144, to the LSB DAC units 134 (L of the LSB DAC units 134) to switch the individual LSB DAC units 134 on and off to convert the L-bit LSB value or a portion of the digital value of the digital input signal 102 to an analog value. Example shown in FIG. 1 is for an 8-bit LSB (i.e., L=8), in which case the LSB signal 144 may include indications for each of 8 LSB binary DAC units 134 as to whether each unit it to transfer a value of 1 or a 0 for the conversion of this L-bit LSB value. For example, the LSB signal 144 may include L individual signals to respective individual LSB DAC units 134, with a one-to-one correspondence between one of the L individual signals of the code signal 144 and a respective one of the L LSB DAC units 134. This is shown in FIG. 1 by showing the individual portions of the code signal 144 as a portion 144-0 ($1^{st}$ portion) provided to the LSB DAC unit 134-0, and so on, until a portion 144-7 ($8^{th}$ portion) provided to the LSB DAC unit 134-7.

In general, various ones of the DAC units 130, 132, and 134 may be scaled/weighted as desired. Therefore, in general, descriptions provided with reference to FIG. 1 are applicable to other types of coding used for different portions of the digital input signal 102, and for different numbers of bits for each of the different portions of the digital input signal 102.

The DAC units 130, 132, and 134 may generate analog voltage or current according to the reference voltage or current provided by the analog bias block 124. The analog adder 126 may then add the outputs from all the DAC units 130, 132, and 134 to generate the final analog output 122, which can be analog voltage or analog current.

Segmented DAC architectures such as the one shown in FIG. 1 enable finding a balance between accuracy and design complexity of a converter. One benefit of segmentation is that it allows reducing the number of DAC units required to achieve a given resolution (e.g., N bits), thus allowing smaller die sizes. Therefore, it is common for high-resolution DACs to be segmented. Adaptive toggle number compensation techniques described herein may be used in, but are not limited to being used in, segmented DACs.

The controller 116 may be configured to generate control signals which control an operation mode of the DAC system 100 (e.g., control power on and off, sample rate, output range, filter bandwidth, etc.), a range of the analog output signal 122, and so on. In particular, the controller 116 may be configured to control implementation of various adaptive toggle compensation techniques described herein, such as transparent ISB dither, MSB shuffle, and dummy toggle generation. Although shown in FIG. 1 as being separate from the segmentation unit 114, in some embodiments the controller 116 may be included within the segmentation unit 114.

Figure 2B:
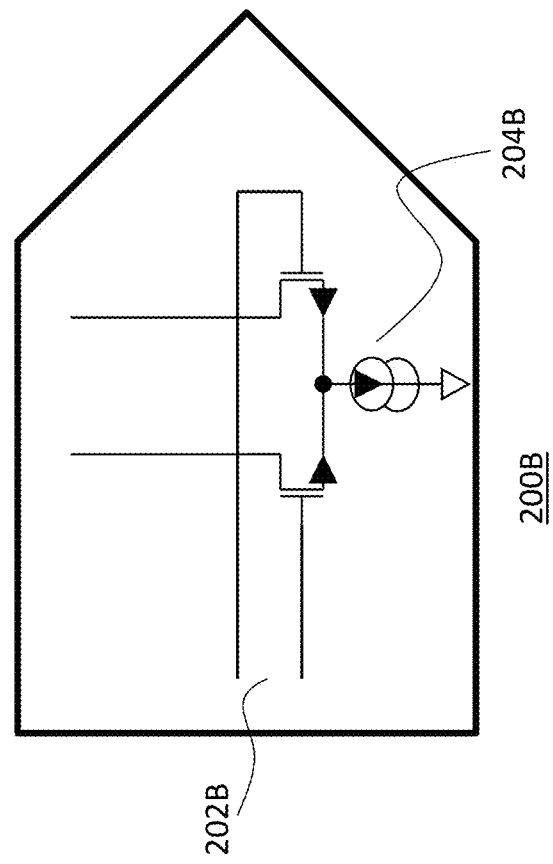
FIGS. 2A and 2B provide schematic illustrations of DAC units using, respectively, P-MOS switches and N-MOS current sources.
Figure 2A:
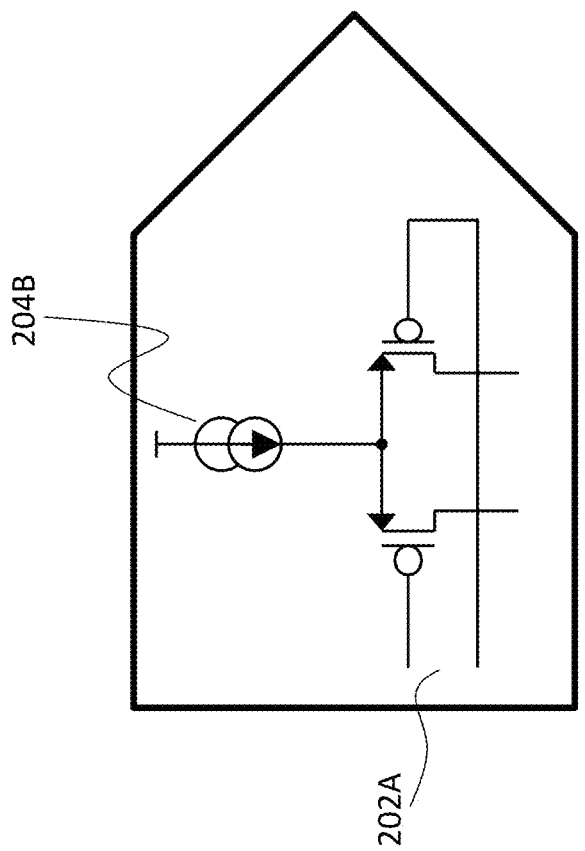

There are many different methods to convert digital input values to analog voltage or current values, switch current being one of the most popular methods for high-speed high-resolution DACs. FIGS. 2A and 2B provide schematic illustrations for DAC units 200A and 200B using, respectively, P-MOS and N-MOS current sources, as known in the art. The DAC units 200A and 200B as shown to receive, respectively, digital input signals 202A and 202B. The digital input signals can be differential digital codes (as shown in the examples of FIGS. 2A and 2B) or single-ended digital codes, depending on the design specification. The DAC units 200A or 200B are configured to control the output of their respective current sources 204A or 204B to provide output current in a DAC system such as the DAC system 100. It is the currents from the current sources such as 204A or 204B that are added together by the adder 126 to generate DAC's final analog current output 122 (similar functionality may be implemented for the voltage output).

Figure 3:
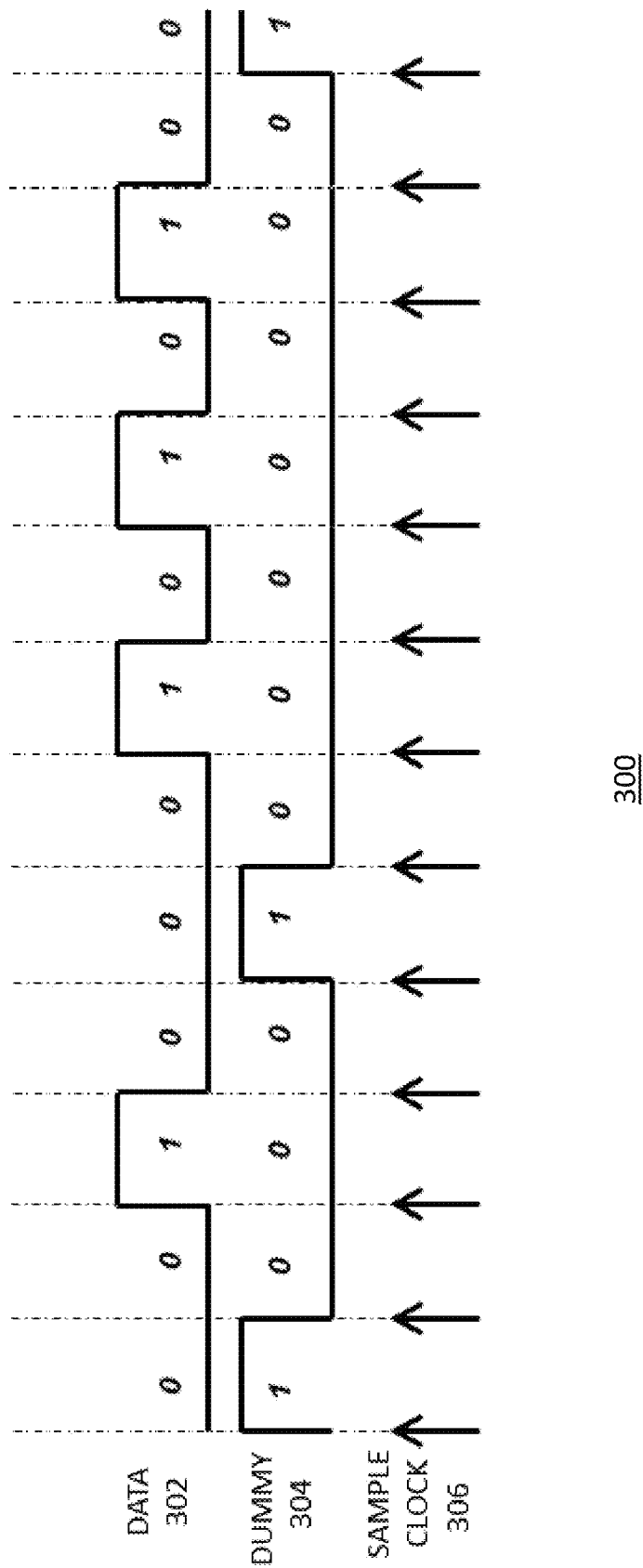
FIG. 3 provides a schematic illustration of an example timing diagram for a data signal and a dummy signal used to reduce data dependent supply noise.

Conventional Dummy Signal Generation to Address Data Dependent Supply Noise Issues FIG. 3 illustrates an example timing diagram 300 for a data signal 302 and a conventional dummy signal 304 used to reduce data dependent supply noise in the manner described above. As shown in FIG. 3, the dummy signal 304 is such that, at each sample clock edge (shown with a sample clock 306), there is a data toggle in one and only one of either the data signal 302 or the dummy signal 304. When two such signals are provided to a DAC unit, e.g., any of the Thermal DAC units or Binary DAC units described above, then, for any data pattern, the DAC unit will act as converting a clock pattern from digital to analog and the DAC output data dependent supply noise will be removed or reduced accordingly.

As DAC's sample rates increase to Giga-Samples per Second (GSPS), the conventional dummy generation method for data dependent supply noise reduction of a DAC as shown in FIG. 3 may encounter substantial implementation problems, e.g., due to the power consumption, sample period and data synchronization requirements. For example, typically, when a conventional dummy signal generation method is implemented, an individual dummy generator is used for each DAC unit employed. If a DAC is implemented as a segmented DAC where thermal and binary DAC units are used, there will always be many data paths for both thermal codes and binary codes and each of them needs an individual dummy data generator for data dependent supply noise reduction. For example, a 16-bit DAC with 5-11 segmentation scheme (e.g., the first 5 of 16 bits of the digital input to be converted are MSB and the last 11 bits are LSB) may use at least 43 DAC units ($2^5$ thermal units and 11 binary units, $2^5+11=43$) and, therefore, would need at least 43 dummy generators. In another example, a 16-bit DAC with 6-10 segmentation scheme would use as many as at least 74 DAC units ($2^6$ thermal units and 10 binary units, $2^6+10=74$) and, therefore, would need at least 74 dummy generators. Considering the large numbers of dummy generators that need to be used in a DAC and considering the tight timing requirements that have to be satisfied for high-speed operation, additional costs in terms of power consumption and die area associated with conventional dummy generation methods may become unacceptable.

Transparent ISB Dither with Adaptive Toggle Compensation

Figure 4:
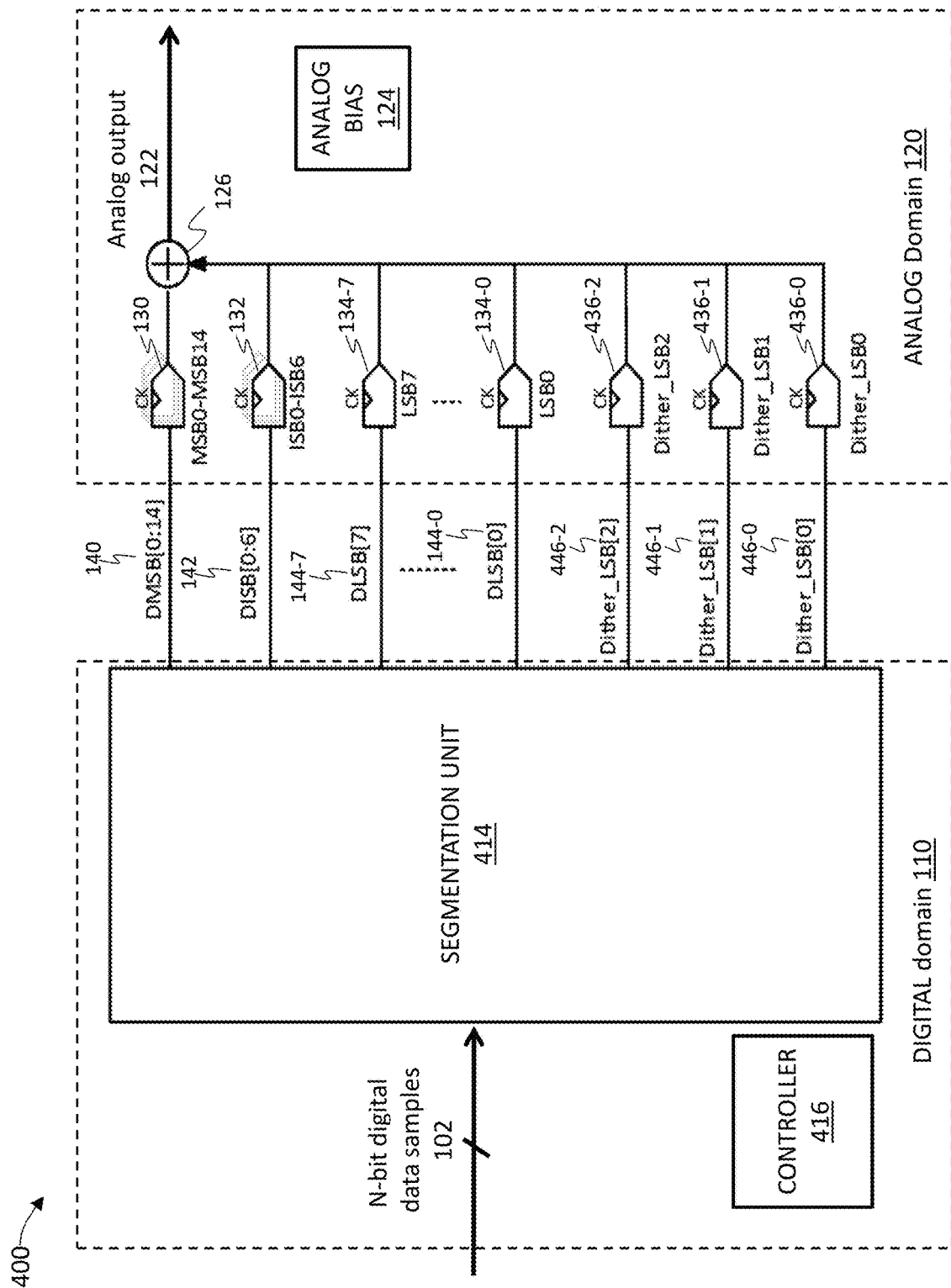
FIG. 4 provides a schematic illustration of an example segmented DAC system with additional dither DAC units for implementing adaptive toggle number compensation with transparent intermediate significant bit (ISB) dither, according to some embodiments of the disclosure.

The first adaptive toggle compensation technique proposed herein is illustrated in FIG. 4, providing a schematic illustration of an example segmented DAC system 400 with additional dither DAC units 436 for implementing adaptive toggle number compensation with transparent ISB dither, according to some embodiments of the disclosure. The DAC system 400 is similar to the DAC system 100 where the reference numerals of FIG. 4 which are the same as in FIG. 1 refer to the same or analogous elements as those described with reference to FIG. 1, so that, in the interests of brevity, their descriptions are not repeated again for FIG. 4. Instead, the differences between FIGS. 1 and 4 are described.

One difference between FIGS. 1 and 4 is that, in contrast to the DAC system 100, the DAC system 400 further includes dither DAC units 436, shown in FIG. 4 as example dither DAC unit 436-0, dither DAC unit 436-1, and dither DAC unit 436-2. Dither DAC units 436 may be binary-coded, with FIG. 4 showing an example of 3-bit binary-coded dither DAC units 436. For example, in some embodiments, the weights of the dither DAC units 436-2, 436-1, and 436-0 may be 8, 4, and 2, respectively. The segmentation unit 414 may be the same as the segmentation unit 114 except that it may further be configured to modify the ISB signals 142 to preserve a target toggle number and generate dither DAC signals 446 to respective dither DAC units 436 to compensate the ISB value as described herein. The controller 416 may be the same as the controller 116 except that it may further be configured to control generation of the dither DAC signals 446 and control modification of the ISB signals 142, as described herein. Although shown in FIG. 4 as being separate from the segmentation unit 414, in some embodiments the controller 416 may be included within the segmentation unit 414.

Transparent ISB dither described herein is referred to as such because it may be applicable to ISB values/portions of the N-bit digital data samples of the digital input 102. However, although descriptions are provided with respect to ISB values, these descriptions are equally applicable to converting any other consecutive bits of the N-bit digital data samples 102.

Transparent ISB dither with adaptive toggle number compensation is similar to a conventional dither approach in that a certain signal is added to the digital data values (e.g., to ISB values) to be converted and then can be accounted for in the analog output 122. However, in contrast to the conventional dither approach, transparent ISB dither with adaptive toggle number compensation as described herein does not add a completely random dither signal, but, rather, a signal that enables preserving a certain total target toggle number for all DAC units used to convert each new data sample. For example, if used for ISB DAC units 132, then transparent ISB dither as described herein enables preserving a certain total target toggle number for the DAC units 132 together. Such an approach may reduce the signal-dependent supply modulation effect while reducing power consumption as compared to conventional dummy signal generation techniques.

Consider an example that the ISB is 3-bit thermal-coded, which means that the ISB DAC units 132 include 7 ($7=2^3-1$) DAC units 132, ISB0-ISB6. Thus, the ISB digital sample to be converted to analog may have an integer value between 0 and 7. The controller 416 may be configured to set a certain target toggle number that is less than the total number of DAC units used to convert such digital samples. Thus, for the example being considered, the controller 416 may be configured to set a certain target toggle number that is less than 7, which the total number of DAC units 132 for the 3-bit thermal-coded ISB example. In general, the controller 416 may be configured to set a certain target toggle number that is less than $2^K-1$ for K-bit thermal-coded digital samples. For example, the target toggle number for this plurality of DAC units may be 5 (because 5 is less than 7), meaning that, as each new digital data sample comes up for conversion, only 5 of the DAC units 132 will switch from transferring value of 0 to transferring value of 1, or vice versa (i.e., for only 5 of the DAC units 132 the digital input value will change from 0 to 1 or from 1 to 0 between conversion of the last digital data sample $S_{n-1}$ and the current digital data sample $S_n$). This means, that, when the total toggle number with the current sample is smaller than the target toggle number, the transparent ISB dither algorithm will flip more ISB bits (which effectively modified the ISB value to be converted by the ISB DACs 132), and when the total toggle number with the current sample is larger than the target toggle number, the transparent ISB dither algorithm will flip less ISB bits (which also effectively modified the ISB value to be converted by the ISB DAC units 132). As a result, the toggle difference at different samples will be reduced, as well as the signal dependency. Since the ISB value to be converted by the ISB DACs 132 is changed/modified, dither DAC units 436 may be used to compensate. Effectively, the dither DAC units 436 may be configured to add a certain value to all digital data samples to be converted, which is equivalent to adding a direct current (DC) signal to the digital signal to be converted. For the 3-bit ISB example considered here, the dither DAC units 436 may be configured to add a value of 7 to all ISB digital samples to be converted, which then provided some room in terms of preserving the target toggle number among the ISB DAC units 132. In this manner, the ISB toggle adjustable range may be from −7 to 7. Modification of the ISB values for conversion and configuration of the dither DAC units 436 may be illustrated with reference to FIG. 5, illustrating some specific examples of original and modified data samples and configuration of the dither DAC units in implementing adaptive toggle number compensation using transparent ISB dither, according to some embodiments of the disclosure.

Figure 5:
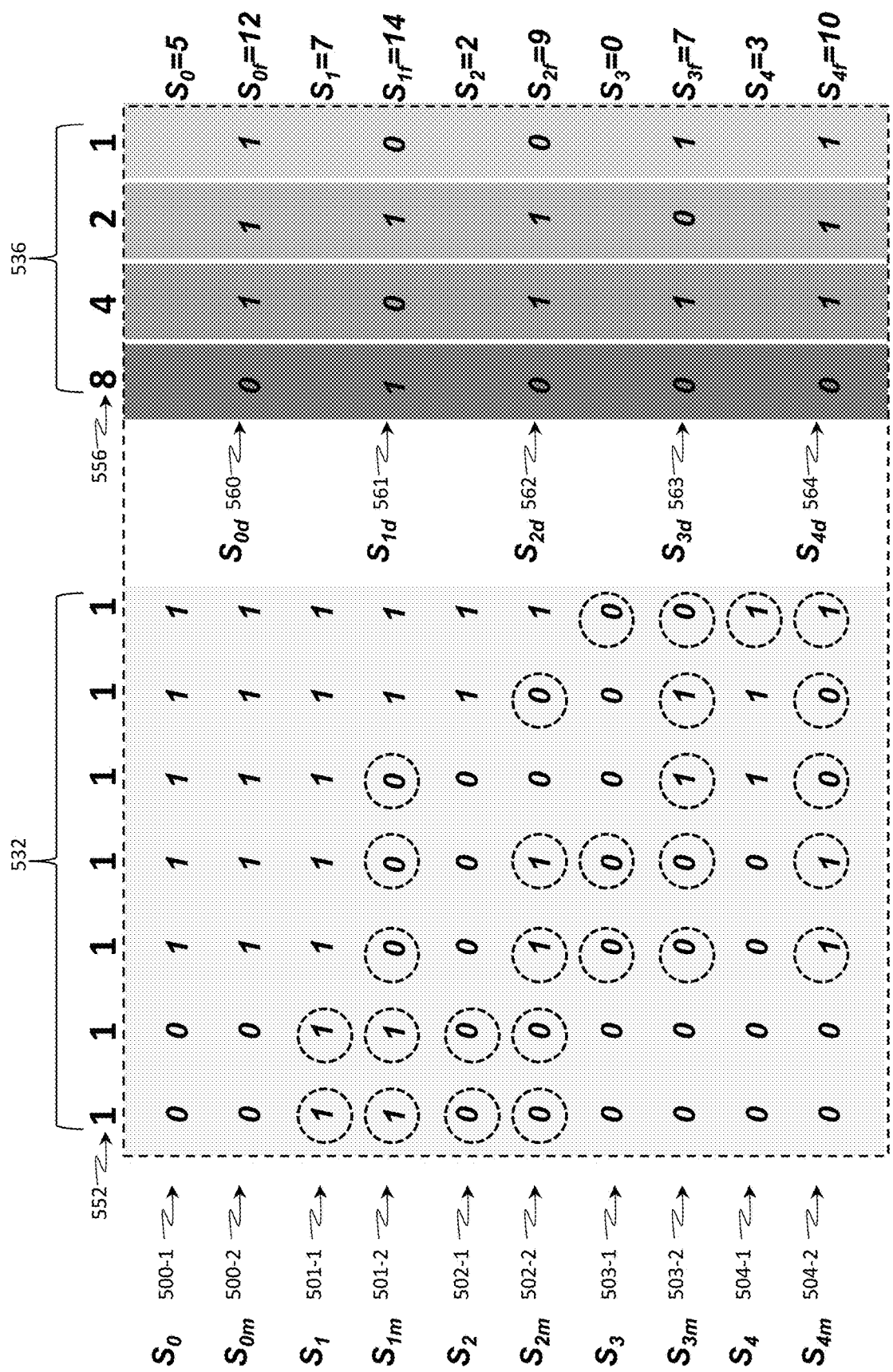
FIG. 5 illustrates examples of original and modified data samples and configuration of the dither DAC units in implementing adaptive toggle number compensation using transparent ISB dither, according to some embodiments of the disclosure.

FIG. 5 illustrates an example of 3-bit digital samples being converted using thermally-coded DAC units, i.e., $2^3-1$ DAC units 532, which may, e.g., be the ISB DAC units 132 of the DAC system 400. FIG. 5 further illustrates an example of 4-bit digital samples being converted using binary-coded dither DAC units, i.e., 4 dither DAC units 536, which may, e.g., be the dither DAC units 436 of the DAC system 400. The fact that the DAC units 532 are thermal-coded is illustrated in FIG. 5 with showing the weights 552 for each of these 7 DAC units to be equal to 1, while the fact that the dither DAC units 536 are binary-coded is illustrated in FIG. 5 with showing the weights 556 for each of these 4 DAC units to be equal to 8, 4, 2, and 1, respectively. Further, FIG. 5 illustrates some example configurations 500-1, 501-1, 502-1, 503-1, and 504-1 of the DAC units 532 if these DAC units are to transfer bits in converting the original digital sample values $S_0$, $S_1$, $S_2$, $S_3$, and $S_4$ shown on the left side of FIG. 5, with their example values given on the right side of FIG. 5. In various configurations shown in FIG. 5, a value of 1 may indicate that a respective DAC unit is on (i.e., the DAC unit transfers the value of 1 for this conversion) and a value of 0 may indicate that the DAC unit is off (i.e., the DAC unit transfers the value of 0 for this conversion), where the different values (i.e., different 0s and 1s) indicate a value being transferred by a different DAC unit. The original digital sample values $S_0$, $S_1$, $S_2$, $S_3$, and $S_4$ may, e.g., be provided in the digital input 102, described above. For the ISB dither implementation, the original digital sample values $S_0$, $S_1$, $S_2$, $S_3$, and $S_4$ may be the ISB digital values of the digital input 102 (for the example shown in FIG. 4, the digital sample values $S_0$, $S_1$, $S_2$, $S_3$, and $S_4$ are 3-bit values, i.e., they carry a value between 0 and 7 and can be converted using 7 thermally-coded ISB DAC units 132, hence each of the configurations 500-1, 501-1, 502-1, 503-1, and 504-1 of the DAC units 532 are also for the example of 7 DAC units 532). FIG. 5 also illustrates example configurations 500-2, 501-2, 502-2, 503-2, and 504-2 of the DAC units 532 if they are to transfer bits in converting modified digital sample values $S_{0m}$, $S_{1m}$, $S_{2m}$, $S_{3m}$, and $S_{4m}$ shown on the left side of FIG. 5 (where the letter "m" in the subscript stands for "modified") because transparent ISB dither being implemented may modify the original digital sample values. The modified digital sample values $S_{0m}$, $S_{1m}$, $S_{2m}$, $S_{3m}$, and $S_{4m}$ include the same number of bits as the original digital sample values $S_0$, $S_1$, $S_2$, $S_3$, and $S_4$ because they are still to be converted by the DAC units 532. Hence, each of the configurations 500-2, 501-2, 502-2, 503-2, and 504-2 shows 7 values for the 7 DAC units 532.

FIG. 5 further illustrates example configurations 560, 561, 562, 563, and 564 of the dither DAC units 536 if they are to transfer binary values in converting the values $S_{0d}$, $S_{1d}$, $S_{2d}$, $S_{3d}$, and $S_{4d}$ shown in the middle of FIG. 5 (where the letter "d" in the subscript stands for "dither"). In general, dither DAC units 536/436 may be configured to convert digital values of 1 more bit than the ISB DAC units 532/132, to give sufficient room for the dither DAC units to compensate for the modification of the original digital values to ensure the target toggle number. That is why example shown in FIG. 5 illustrates that each of the digital values $S_{0d}$, $S_{1d}$, $S_{2d}$, $S_{3d}$, and $S_{4d}$ are 4-bit values (because dither DAC units are binary-coded, so a 4-bit value may be converted using 4 dither DAC units). Hence, each of the configurations 560, 561, 562, 563, and 564 shows 4 values for the 4 dither DAC units 536. Different ones of the values $S_{0d}$, $S_{1d}$, $S_{2d}$, $S_{3d}$, and $S_{4d}$ may be added to the corresponding modified digital sample values $S_{0m}$, $S_{1m}$, $S_{2m}$, $S_{3m}$, and $S_{4m}$ to produce respective final digital sample values $S_{0f}$, $S_{1f}$, $S_{2f}$, $S_{3f}$, and $S_{4f}$ (with their example values given on the right side of FIG. 5, where the letter "f" in the subscript stands for "final"). In general, $S_{if}=S_{im}+S_{id}$, where "i" is an index of a given digital sample value (e.g., for the sample $S_0$, $S_{0f}=S_{0m}+S_{0d}$; for the sample $S_1$, $S_{1f}=S_{1m}+S_{1d}$; for the sample $S_2$, $S_{2f}=S_{2m}+S_{2d}$; and so on). Thus, the dither DAC units 536 may add a certain constant value C to all original data samples $S_0$, $S_1$, $S_2$, $S_3$, etc. to yield the final data values $S_{0f}$, $S_{1f}$, $S_{2f}$, $S_{3f}$, and $S_{4f}$ which means that $S_{if}=S_0+C$ (e.g., for the sample $S_0$, $S_{0f}=S_0+C$; for the sample $S_1$, $S_{1f}=S_1+C$; for the sample $S_2$, $S_{2f}=S_2+C$, and so on). This DC addition will make a very small change on the common-mode voltage of analog output 122 but will not impact the signal quality at analog output 122.

Again, the example of FIG. 5 assumes that the target toggle number for the transparent ISB dither is 5. Further assume that the dither DAC units 536 are to add a value of 7 (i.e., C=7) to all original data samples $S_0$, $S_1$, $S_2$, $S_3$, etc. to yield the final data values $S_{0f}$, $S_{1f}$, $S_{2f}$, $S_{3f}$, and $S_{4f}$ (i.e., $S_{0f}=S_0+7$, $S_{1f}=S_1+7$, $S_{2f}=S_2+7$, $S_{3f}=S_3+7$, and so on).

As shown in the example of FIG. 5, the first original digital value to be converted by the DAC units 532 may be $S_0=5$ (i.e., 5 DAC units 532 are shown, in the configuration 500-1, to be transferring the value of "1" and the rest are at "0"). Assuming that before that all DAC units 532 were at "0", this means that there are already 5 toggles in converting the digital sample $S_0$, which means that no modification to the digital data sample $S_0$ is needed (i.e., the modified data sample $S_0$, is the same as $S_0$, $S_{0m}=S_0=5$) and the dither DAC units 536 output the value $S_{0d}$ (configuration 560) which is 7, resulting in the final output value $S_{0f}$ of 12 (i.e., $S_{0f}=S_0+7$, which, in this case is 12=5+7; and $S_{0f}=S_{0m}+S_{0d}$, which, in this case is 12=5+7).

The next original digital value to be converted by the DAC units 532 may be $S_1=7$ (i.e., 7 DAC units 532 are shown, in the configuration 501-1, to be transferring the value of "1" and none are at "0"). Compared to the previous digital value converted by the DAC units 532, namely, the value $S_{0m}$, this would mean only 2 toggles (where the toggles in the DAC units 532 for the original value $S_1$ are shown in FIG. 5 by being circled with dashed circles in the digital sample configuration 501-1). This toggle number is less than the target toggle number of 5, which means that a modification to the digital data sample $S_1$ is needed to bring up the toggle number for the modified digital data sample to 5 (i.e., the modified data sample $S_{1m}$ is modified to ensure that there is the target toggle number between conversion of the current modified data sample $S_{1m}$ and the previous data sample $S_{0m}$). In one example, the modified data sample $S_{1d}$, may be as shown in FIG. 5, i.e., $S_{1m}=4$, in which case the dither DAC units 536 may output the value $S_{1d}$ (configuration 561) which is 10, resulting in the final output value $S_{1f}$ of 12 (i.e., $S_{1f}=S_1+7$, which, in this case is 14=7+7; and $S_{1f}=S_{1m}+S_{1d}$, which, in this case is 14=4+10). With such a modified data sample $S_{1m}$, the target toggle number of 5 is reached, compared to the previous data sample $S_{0m}$ that was converted by the DAC units 532 (where the toggles in the DAC units 532 for the modified value $S_{1m}$ are shown in FIG. 5 by being circled with dashed circles in the digital configuration 501-2).

The next original digital value to be converted by the DAC units 532 may be $S_2=2$ (i.e., 2 DAC units 532 are shown, in the configuration 502-1, to be transferring the value of "1" and the rest are at "0"). Compared to the previous digital value converted by the DAC units 532, namely, the value $S_{1m}$, this would mean only 2 toggles (where the toggles in the DAC units 532 for the original value $S_2$ are shown in FIG. 5 by being circled with dashed circles in the digital sample configuration 502-1). This toggle number is less than the target toggle number of 5, which means that a modification to the digital data sample $S_2$ is needed to bring up the toggle number for the modified digital data sample to 5 (i.e., the modified data sample $S_{2m}$ is modified to ensure that there is the target toggle number between conversion of the current modified data sample $S_{2m}$ and the previous data sample $S_{1m}$). In one example, the modified data sample $S_{2m}$ may be as shown in FIG. 5, i.e., $S_{2m}=3$, in which case the dither DAC units 536 may output the value $S_{2d}$ (configuration 562) which is 6, resulting in the final output value $S_{2f}$ of 14 (i.e., $S_{2f}=S_2+7$, which, in this case is 9=2+7; and $S_{2f}=S_{2m}+S_{2d}$, which, in this case is 9=3+6). With such a modified data sample $S_{2m}$, the target toggle number of 5 is reached, compared to the previous data sample $S_{1m}$ that was converted by the DAC units 532 (where the toggles in the DAC units 532 for the modified value $S_{2m}$ are shown in FIG. 5 by being circled with dashed circles in the digital configuration 502-2).

The next original digital value to be converted by the DAC units 532 may be $S_3=0$ (i.e., all DAC units 532 are shown, in the configuration 503-1, to be transferring the value of "0"). Compared to the previous digital value converted by the DAC units 532, namely, the value $S_{2m}$, this would mean only 3 toggles (where the toggles in the DAC units 532 for the original value $S_3$ are shown in FIG. 5 by being circled with dashed circles in the digital sample configuration 503-1). This toggle number is less than the target toggle number of 5, which means that a modification to the digital data sample $S_3$ is needed to bring up the toggle number for the modified digital data sample to 5 (i.e., the modified data sample $S_{3m}$ is modified to ensure that there is the target toggle number between conversion of the current modified data sample $S_{3m}$ and the previous data sample $S_{2m}$). In one example, the modified data sample $S_{3m}$ may be as shown in FIG. 5, i.e., $S_{3m}=2$, in which case the dither DAC units 536 may output the value $S_{3d}$ (configuration 563) which is 5, resulting in the final output value $S_{3f}$ of 7 (i.e., $S_{3f}=S_3+7$, which, in this case is 7=0+7; and $S_{3f}=S_{3m}+S_{3d}$, which, in this case is 7=2+5). With such a modified data sample $S_{3m}$ the target toggle number of 5 is reached, compared to the previous data sample $S_{2m}$ that was converted by the DAC units 532 (where the toggles in the DAC units 532 for the modified value $S_{3m}$ are shown in FIG. 5 by being circled with dashed circles in the digital configuration 503-2).

For the last example shown in FIG. 5, the next original digital value to be converted by the DAC units 532 may be $S_4=3$ (i.e., 3 DAC units 532 are shown, in the configuration 504-1, to be transferring the value of "1" and the rest are at "0"). Compared to the previous digital value converted by the DAC units 532, namely, the value $S_{3m}$, this would mean only 1 toggles (where the toggles in the DAC units 532 for the original value $S_4$ are shown in FIG. 5 by being circled with dashed circles in the digital sample configuration 504-1). This toggle number is less than the target toggle number of 5, which means that a modification to the digital data sample $S_4$ is needed to bring up the toggle number for the modified digital data sample to 5 (i.e., the modified data sample $S_{4m}$ is modified to ensure that there is the target toggle number between conversion of the current modified data sample $S_{4m}$ and the previous data sample $S_{3m}$). In one example, the modified data sample $S_{4m}$ may be as shown in FIG. 5, i.e., $S_{4m}=3$, in which case the dither DAC units 536 may output the value $S_{4d}$ (configuration 564) which is 7, resulting in the final output value $S_{4f}$ of 10 (i.e., $S_{4f}=S_4+7$, which, in this case is 10=3+7; and $S_{4f}=S_{4m}+S_{4d}$, which, in this case is 10=3+7). With such a modified data sample $S_{4m}$ the target toggle number of 5 is reached, compared to the previous data sample $S_{3m}$ that was converted by the DAC units 532 (where the toggles in the DAC units 532 for the modified value $S_{4m}$ are shown in FIG. 5 by being circled with dashed circles in the digital configuration 503-2).

Different variations are possible to the above-described basic transparent ISB dither scheme, some of which will now be described below.

First of all, in various embodiments, configurations for the modified digital samples (i.e., an indication for each one of the DAC units 532 as to whether the DAC unit 532 is supposed to transfer a value of 0 and or a value of 1) may be different from those shown in FIG. 5, as long as each modified digital sample results in the target toggle number for the conversion of the current digital data sample. For example, in some embodiments, the segmentation unit 414 and/or the controller 416 may attempt to randomize which ones of the DAC units 532 are switched on (e.g., transfer the value of 1) for conversion of a given digital data sample, as long as the target toggle number is preserved for the conversion. In some embodiments, the targeted toggle number of ISB dither can be randomized in a specified range, as will be described in greater detail with reference to FIG. 7. These randomizations may help break ISB data pattern and transfer tone to noise and may be helpful in terms of the DAC back-off performance due to the dither DAC unit timing error.

It should also be noted that while descriptions provided herein refer to preserving or ensuring that the target toggle number is achieved, these descriptions are to be understood to include some reasonably small deviations from the target toggle number. For example, example shown in FIG. 5 illustrates 4 dither DAC units 536 with weights 8, 4, 2, and 1. However, in some embodiments, less dither DAC units 536 may be used, which would provide advantages in terms of reduced die area and power consumption, but that may be at a cost of not always achieving the target toggle number. For example, instead of the 4 dither DAC units with weights 8, 4, 2, and 1, the example of FIG. 5 may use 3 dither DAC units 536 with weights 8, 4, and 2. It should also be noted that less dither DAC units may be used by carefully selecting a suitable target toggle number, e.g., for a given digital signal to be converted. For example, in some implementations the target toggle number may be set so that at each sample only even dither DAC data is needed to compensate the ISB value, in which case the DAC units 536 with the weight of 1 may advantageously be eliminated. Thus, in general, for converting a K-bit digital sample (K being an integer greater than 1) using transparent ISB dither as described herein (e.g., if the ISB portions of the digital data samples 102 are K-bit values), $2^K-1$ thermometer-coded regular DAC units (e.g., ISB DAC units 132) and K+1 binary-coded dither DAC units (e.g., the dither DAC units 436/536) may be used in some embodiments. In other embodiments of such a general case, less than K+1 binary-coded dither DAC units may be used, e.g., only K dither DAC units, e.g., with the LSB binary-coded dither DAC unit (i.e., the one with the weight of 1) not used.

In some embodiments, the weight of the dither DAC unit MSB (i.e., the highest weight of all of the dither DAC units 536/436) may be the same as the weight of the MSB DAC units 130. In such embodiments, instead of using the dither DAC MSB unit, one of the MSB DAC units 130 can be randomly used to transfer the different samples of dither DAC MSB. This may be helpful in terms of the DAC back-off performance due to the dither DAC unit timing error.

Toggle-Controllable MSB Shuffle

Figure 6:
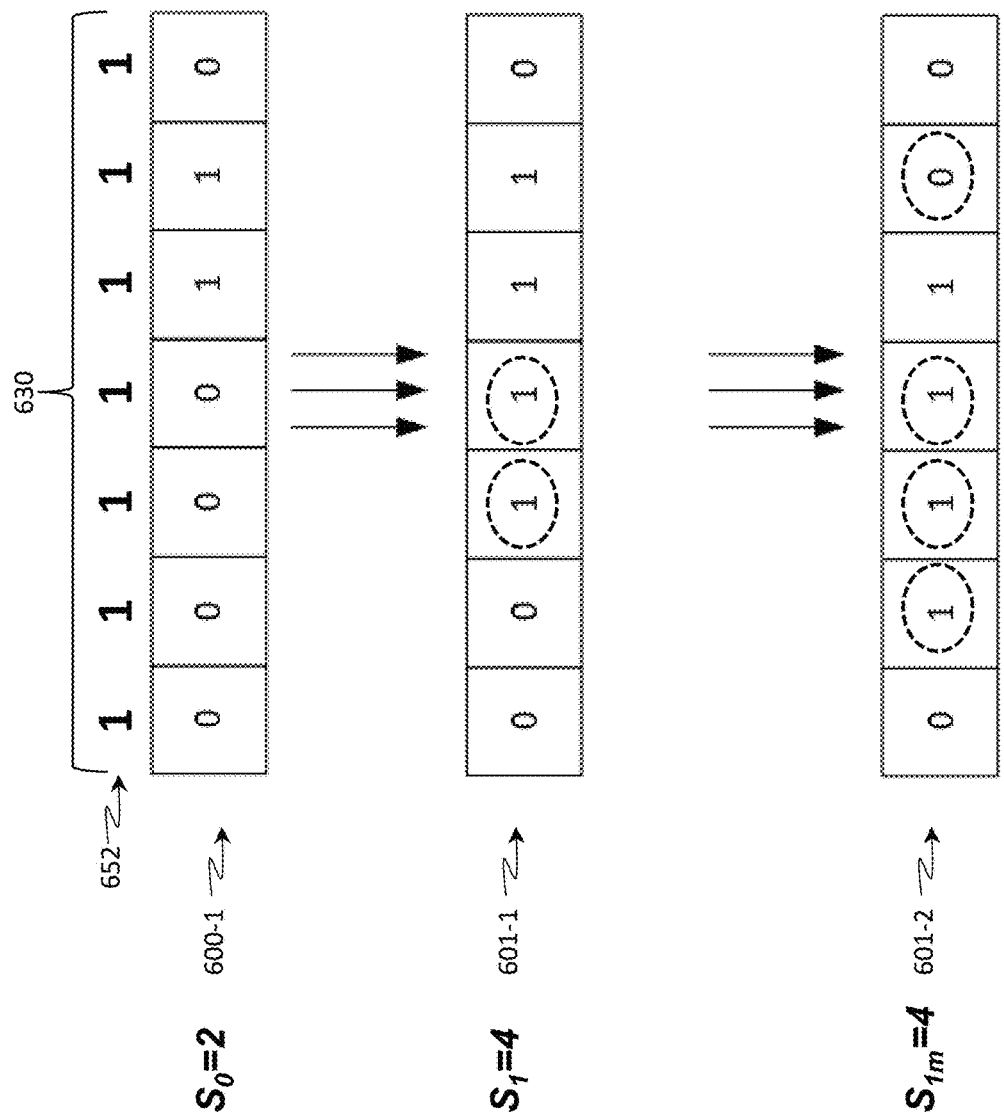
FIG. 6 illustrates examples of data samples and configuration of most significant bit (MSB) DAC units in implementing adaptive toggle number compensation with MSB shuffle, according to some embodiments of the disclosure.

The second adaptive toggle compensation technique (toggle-controllable MSB shuffle) proposed herein may be implemented either in the segmentation unit 414 of FIG. 4 (e.g., be implemented in combination with the transparent ISB dither described above) or in the segmentation unit 114 of FIG. 1 (e.g., be implemented in the DAC system 100 that does not implement the transparent ISB dither). In such embodiments, the segmentation unit 114/414 may further be configured to modify the MSB signals 140 to control a target toggle number as described herein. Similarly, the controller 116/416 may further be configured to control modification of the MSB signals 140, as described herein. FIG. 6 provides an illustration of examples of data samples and configuration of DAC units in implementing adaptive toggle number compensation with MSB shuffle, according to some embodiments of the disclosure. Similar to the illustration of FIG. 5, FIG. 6 illustrates an example of 3-bit digital samples being converted using thermally-coded DAC units, i.e., $2^3-1$ DAC units 630, which may, e.g., be the MSB DAC units 130 of the DAC system 100 or 400. Also similar to FIG. 5, the fact that the DAC units 630 are thermal-coded is illustrated in FIG. 6 with showing the weights 652 for each of these 7 DAC units to be equal to 1. Further similar to FIG. 5, FIG.

6 illustrates some example configurations 600-1 and 601-1 of the DAC units 630 if these DAC units are to transfer bits in converting the original digital sample values $S_0$ and $S_1$ shown on the left side of FIG. 6, as well as a modified configuration 601-2 of the DAC units 630 for converting a modified sample value $S_{1m}$ with MSB shuffle to ensure that the target toggle number is achieved. Similar to FIG. 5, in various configurations shown in FIG. 6, a value of 1 may indicate that a respective DAC unit is on (i.e., the DAC unit transfers the value of 1 for this conversion) and a value of 0 may indicate that the DAC unit is off (i.e., the DAC unit transfers the value of 0 for this conversion), where the different values (i.e., different 0s and 1s) indicate a value being transferred by a different DAC unit. The original digital sample values $S_0$ and $S_1$, shown in FIG. 6, may, e.g., be provided in the digital input 102, described above.

The MSB shuffle adaptive toggle compensation technique proposed herein is based on implementing the shuffle option for the MSB bits while simultaneously controlling the MSB toggle number. In some embodiments, the toggle controllability can be used for toggle compensation at each new digital sample being converted, so that the signal dependency can be reduced. This concept may be illustrated with reference to FIG. 6, for the example of the target toggle number for the MSB shuffle being 4. Assume that the first digital sample $S_0$ has a value of 2 and the second digital sample $S_1$ has a value of 4. Also assume that the configurations of the DAC units 630 for converting the samples $S_0$ and $S_1$ may be as shown in FIG. 6 with the configurations 600-1 and 601-1, respectively. In such a scenario, there are only 2 toggles (where the toggles in the DAC units 630 for the original value $S_1$ are shown in FIG. 6 by being circled with dashed circles in the digital sample configuration 601-1, a notation similar to that used in FIG. 5). This toggle number is less than the target toggle number of 4, which means that a modification to converting the digital data sample $S_1$ is needed to bring up the toggle number for the modified digital data sample to 4. In contrast to the transparent ISB dither described above, the value of the sample $S_1$ itself is not modified, but the configuration of the DAC units 630 is modified to achieve the target toggle number, as shown in FIG. 6 with the configuration 601-2 for the modified digital sample $S_{1m}$. The modified digital sample $S_{1m}$ still has the same value of 4, but the configuration of the DAC units 630 transferring this value is now such that there are 4 toggles between the configuration 600-1 of the previous digital sample $S_0$ and the configuration 601-2 of the current digital sample $S_{1m}$.

Different variations are possible to the above-described basic MSB shuffle scheme, some of which will now be described below.

First of all, in various embodiments, configurations for the modified digital samples (i.e., an indication for each one of the DAC units 630 as to whether the DAC unit 630 is supposed to transfer a value of 0 and or a value of 1) may be different from those shown in FIG. 6, as long as each modified configuration results in the target toggle number for the conversion of the current digital data sample. For example, instead of adding (or removing) the 1s at the left side in FIG. 6, in other embodiments it is possible to add (or remove) the 1s at right side, or randomly set the location at each sample. For another example, instead of moving the 1s to the left direction as shown in FIG. 6, the 1s may be moved to the right direction, or the direction may be set randomly at each sample. In yet another example, at least some of the 1s shown in the configuration 601-2 may be not consecutive.

In other embodiments, other configurations are possible that would still ensure that the target toggle number is achieved.

In some embodiments, the targeted toggle number of MSB shuffle can be randomized in a specified range, as will be described in greater detail with reference to FIG. 7. These randomizations may help break MSB data pattern and transfer tone to noise and may be helpful in terms of the DAC back-off performance due to the dither DAC unit timing error.

The toggle adjustable range of the MSB shuffle proposed herein may be data-dependent:

MSB_max_toggle($n$)=MSB_val($n$)+MSB_val($n-1$),
when MSB_val($n$)+MSB_val($n-1$)<=$N$;

MSB_max_toggle($n$)=2*$N$−MSB_val($n$)−MSB_val
($n-1$), when MSB_val($n$)+MSB_val($n-1$)>$N$;
and MSB_min_toggle($n$)=abs(MSB_val($n$)−MSB_val($n-$
1)), where N is the number of MSB DAC units, n is the current digital sample being converted, and n−1 is the last digital sample that was converted.

Toggle-Controllable Dummy Toggle Generation

The transparent ISB dither and/or MSB shuffle described above may already significantly improve DAC performance while preserving power consumption and die area. If these are still not enough, in some embodiments, the third adaptive toggle compensation technique, namely the toggle-controllable dummy toggle generation, may be implemented in addition to the transparent ISB dither with adaptive toggle compensation and/or toggle-controllable MSB shuffle to provide further improvements in terms of data dependent supply noise. The third adaptive toggle compensation technique (toggle-controllable dummy toggle generation) proposed herein may be implemented either in the segmentation unit 414 of FIG. 4 (e.g., be implemented in combination with the transparent ISB dither with adaptive toggle compensation and/or toggle-controllable MSB shuffle described above) or in the segmentation unit 114 of FIG. 1 (e.g., be implemented in the DAC system 100 that does not implement the transparent ISB dither with adaptive toggle compensation but implements the toggle-controllable MSB shuffle, or be implemented in the DAC system 100 that does not implement any of the transparent ISB dither with adaptive toggle compensation and the toggle-controllable MSB shuffle). In such embodiments, the DAC system 100/400 would further include one or more dummy DAC units (not specifically shown in FIGS. 1 and 4) and the segmentation unit 114/414 may further be configured to provide control signals to the one or more dummy DAC units to control a target toggle number as described herein. Similarly, the controller 116/416 may further be configured to control modification of the control signals provided to the one or more dummy DAC units, as described herein. Such one or more dummy DAC units may be similar to other DAC units described herein, except that the outputs generated by the one or mode dummy DAC units would not be added by the adder 126 to generate the analog output 122.

In some embodiments, such dummy toggle generation may include providing dummy data to one or more dummy DAC units (again, not specifically shown in FIGS. 1 and 4) in an attempt to reach the target toggle number for all DAC units (i.e., dummy DAC units and the DAC units 130, 132, and 134). For example, if the MSB shuffle and/or transparent ISB dither described above are not enough to achieve the target toggle number for a given conversion, then dummy toggle generation may provide dummy data to one or more of dummy DAC units to help achieve the target toggle number. Such dummy data is different from conventional dummy data generation approach described above in that it is configured to control the overall toggle number of all DAC units used for the conversion. Namely, the toggle-controllable dummy toggle generation will only configure one or more of the dummy DAC units to toggle if the target toggle number of all DAC units 130, 132, and 134 is not enough and will not toggle if the total target toggle number is enough. As a result, the number of dummy DAC units that would be included in the DAC system 100/400 to implement the toggle-controllable dummy toggle generation would be much less than the total number of DAC units 130, 132, 134 (in contrast to the conventional dummy signal generation described above), resulting in substantial savings in terms of power consumption and die area. Therefore, such dummy toggle generation may be seen as the third adaptive toggle compensation technique proposed herein.

Toggle Processing Unit

Figure 7:
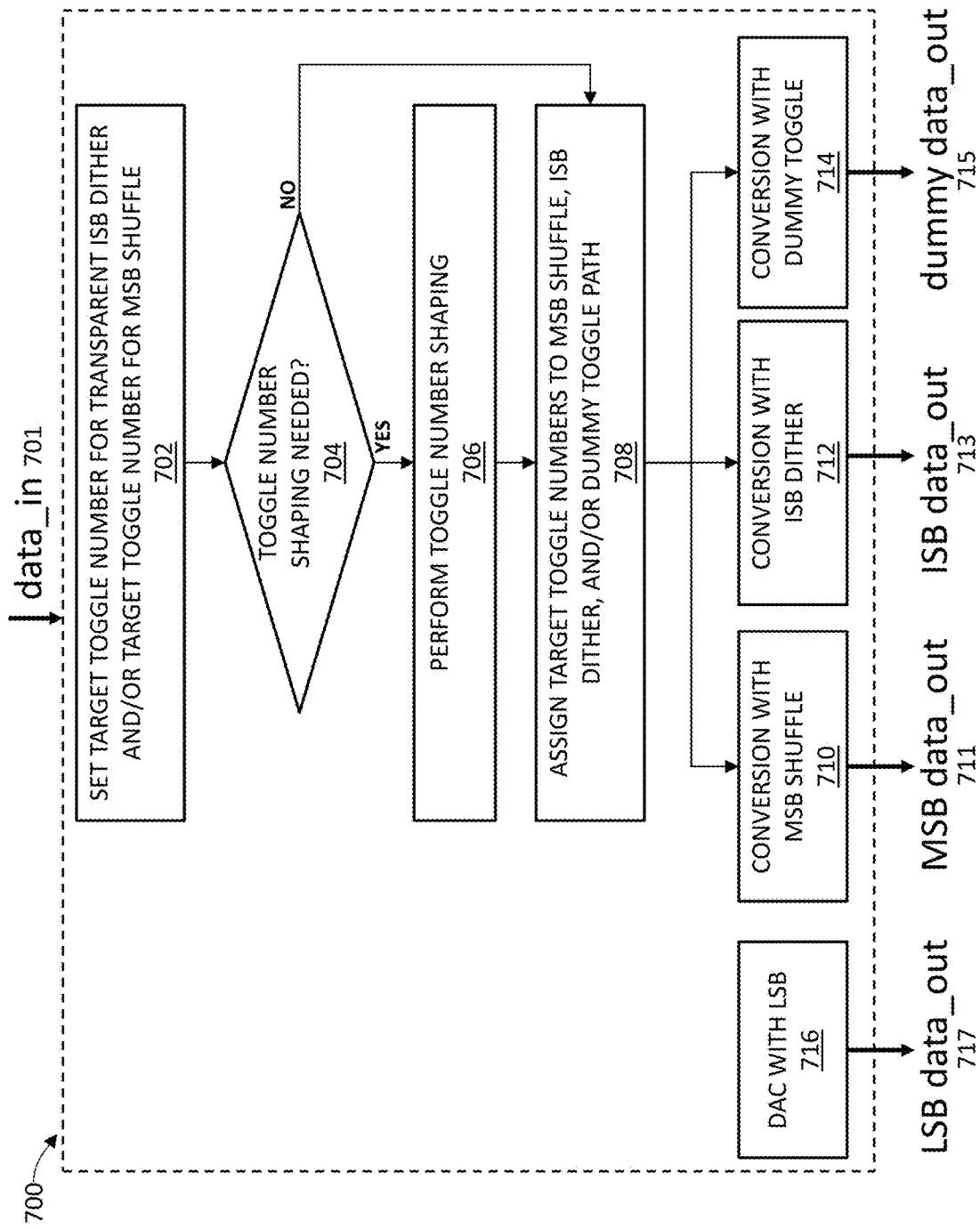
FIG. 7 provides a block diagram illustrating a method for performing digital-to-analog conversion with adaptive toggle number compensation using one or more of transparent ISB dither, MSB shuffle, and dummy toggle generation (dummy toggle path), according to some embodiments of the present disclosure.

FIG. 7 provides a block diagram illustrating a method 700 for performing digital-to-analog conversion with adaptive toggle number compensation using one or more of transparent ISB dither, MSB shuffle, and dummy toggle generation (dummy toggle path), according to some embodiments of the present disclosure. Description of the method 700 is provided with reference of the components of the DAC system 400 shown in FIG. 4, where, e.g., the segmentation unit (decoder) 414 may be configured to perform one or more of the transparent ISB dither with adaptive toggle compensation, the toggle-controllable MSB shuffle, the toggle-controllable dummy toggle generation, and the toggle processing unit as described herein. However, any DAC system, configured to implement the processes of the method 700, in any suitable order, is within the scope of the present disclosure.

The method 700 may begin with 702, where the data input (data_in) 701 is provided to the DAC system 400. The data input may be, e.g., the N-bit digital data samples 102. In 702, the controller 416 may set the target toggle number for transparent ISB dither and/or MSB shuffle with adaptive toggle compensation as described herein. In some embodiments, setting one or more of these toggle numbers in 702 may include the controller 416 accessing pre-set toggle numbers (e.g., these toggle numbers may be pre-programmed). In other embodiments, setting one or more of these toggle numbers in 702 may include the controller 416 establishing which toggle numbers are suitable in a given situation, e.g., based on the digital input data received or expected to be received and/or based on based on MSB/ISB toggle adjustable range. In some embodiments, the controller 416 may be configured to re-calculate the MSB toggle adjustable range in real-time due to its data-dependent property, described above.

In some embodiments of 702, the controller 416 may be configured to randomly assign target toggle numbers to the transparent ISB dither and MSB shuffle based on the calculated ISB/MSB toggle adjustable range at each data sample. For example, a DAC system may be given a certain target total toggle number, and the controller 416 may be configured to assign the toggle number to both transparent ISB dither with adaptive toggle compensation and toggle-controllable MSB shuffle, described herein. In some embodiments, e.g. for each sample (e.g., for each digital sample of the input signal 102 to be converted), the transparent ISB dither with adaptive toggle compensation and the toggle-controllable MSB shuffle may have their own toggle adjustable range. For example, for sample 1 of the input signal 102, the ISB toggle range may be between 0 and 7, and the MSB toggle range may be between 7 and 28. If, e.g., the target total toggle number is 20, then, in some embodiments, the ISB target toggle number may be 0 and the MSB target toggle number may be 20, or, in other embodiments, the ISB target toggle number may be 7 and the MSB target toggle number may be 13. Since there are a lot of options in dividing the target total toggle number between the transparent ISB dither with adaptive toggle compensation and toggle-controllable MSB shuffle, randomization can be used. Then, as another digital sample of the input signal 102 is being converted, e.g., sample 2, the toggle adjustable range may be changed, and, therefore, the assignment and randomization may be changed accordingly. In other embodiments, the controller 416 may not implement such a random toggle number assignment and try to use the transparent ISB dither algorithm to compensate toggle as much as possible. In such a case, MSB toggles/randomization may be reduced, achieving better noise with worse distortion as compared to random assignment.

Figure 8:
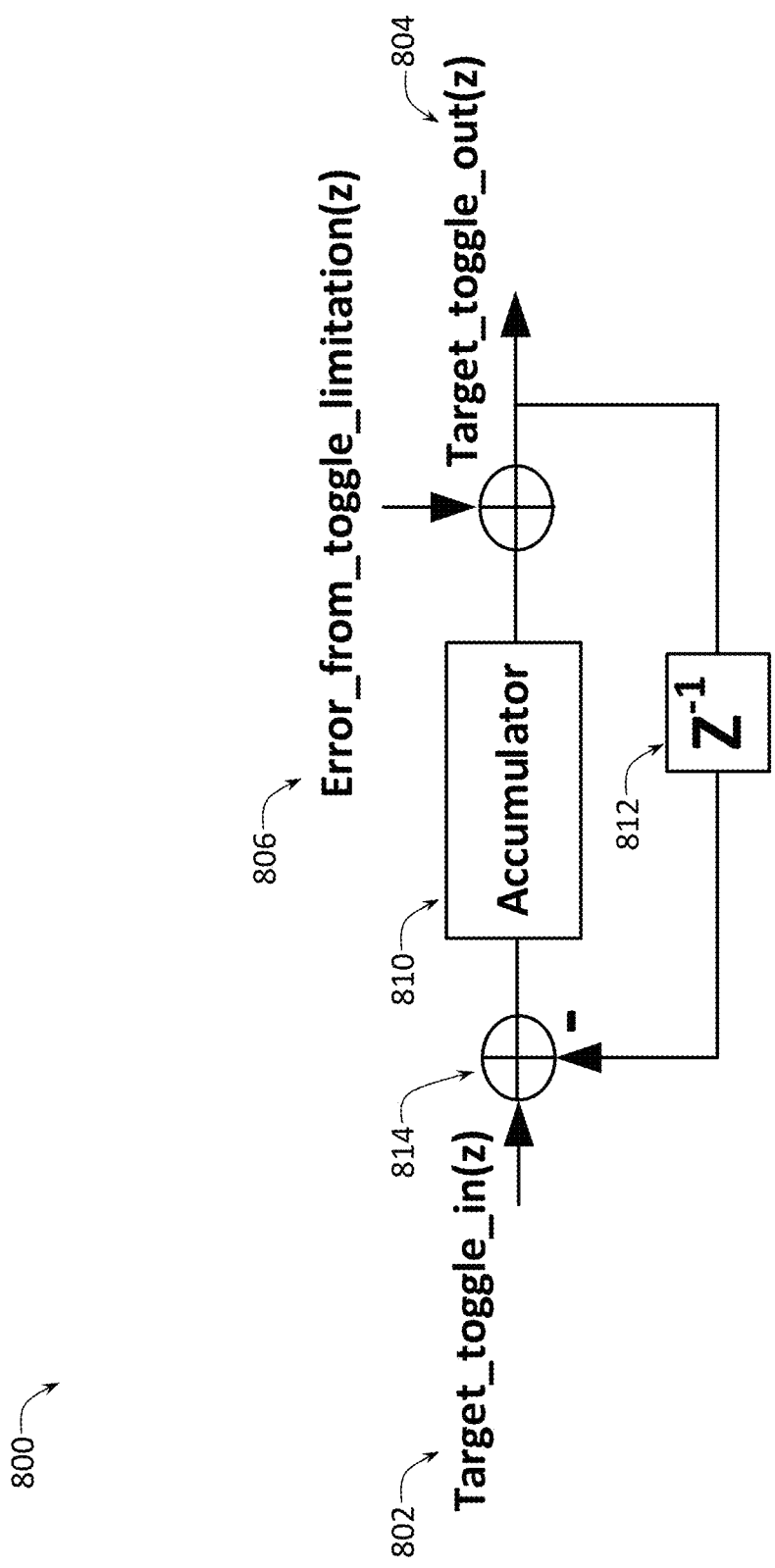
FIG. 8 illustrates toggle shaping with a 1st order delta-sigma, according to some embodiments of the present disclosure.

The method 700 may then proceed with optional 704 and 706. In 704, the controller 416 may be configured to determine whether toggle number shaping might be needed and, if needed, perform the toggle shaping in 706. This may be an option to tolerate some toggle differences if the adjustable range is not enough. For example, in some embodiments, 1st order delta-sigma toggle shaping 800 as shown in FIG. 8 can be used. As described above, the toggle-controllable MSB shuffle and the transparent ISB dither with adaptive toggle compensation may have a toggle adjustable range, and the toggle adjustable range of MSB shuffle may be dependent on the data samples. Suppose that it is not possible to achieve the target toggle number at the last sample, e.g., due to the error from MSB/ISB toggle limitation at the last sample. In such a case, the difference between target_toggle_out 804 at last sample and target_toggle_in 802 at current sample may be accumulated in an accumulator 810 (where the target_toggle_out 804 of the last sample may be delayed by a delay element 812 so that it can be added to the target_toggle_in 802 at current sample by an adder 814), as shown in FIG. 8. The target_toggle_out 804 at current sample may be decided by the output of the accumulator 810 and the error 806 from MSB/ISB toggle limitation at the current sample. As a result, the average value of target_toggle_out of multiple samples may be equal to target_toggle_in 802, and the toggle current at relatively low frequency may be largely reduced. In some embodiments, toggle shaping mode may be compatible with normal adaptive toggle compensation mode. When toggle adjustable range is enough, the error 806 from the toggle limitation may be 0, target_toggle_out 804 may be equal to target_toggle_in 802, and the toggle shaping mode is the same as normal mode.

Either if the toggle number shaping was determined to not be needed in 704, or if toggle shaping of 704 and 706 was not implemented, the method 700 may then proceed with 708, where the controller 416 may assign the target toggle numbers to the transparent ISB dither and/or MSB shuffle based on the results of 702-706. In some embodiments, the controller 416 may also be configured to determine in 708 whether to implement dummy toggle generation for any of the DAC units 130, 132, and 134 and assign dummy toggle paths accordingly. For example, in some embodiments, the controller 416 may be configured to turn on some dummy toggle paths if the toggle compensation of 702 and/or toggle shaping of 704 and 706 is still not enough, which may, e.g., be the case for high fout scenarios where a DAC with lower fout can tolerate more toggle differences.

The method 700 may then proceed with performing digital-to-analog conversion of MSB samples at 710, performing digital-to-analog conversion of ISB samples at 712, and performing digital-to-analog conversion with dummy toggle at 714. In some embodiments, 710 may include the MSB DAC units 130 implementing the MSB shuffle as described herein. In some embodiments, 712 may include the ISB DAC units 132 implementing the transparent ISB dither, together with the ISB dither DAC units 432, as described herein. In some embodiments, 714 may include one or more of the dummy DAC units further implementing the dummy toggle compensation as described herein. The method 700 may further include 716, where the LSB samples of the input data 701 (data_in, shown in FIG. 7) are converted using the LSB DAC units 134.

As shown in FIG. 7, as a result of performing the digital-to-analog conversion of 710-716, analog outputs MSB data_out 711, ISB data_out 713, dummy data_out 715, and LSB data_out 717 are generated. Although not specifically shown in FIG. 7, the method 700 may further include the adder 126 adding the analog outputs 711, 713, and 715 to generate the analog output 122.

Although also not specifically shown in FIG. 7, the method 700 may further include the controller 416 monitoring toggle number error (i.e., any deviations of the actual toggle number from the target toggle number). The controller 416 may then use this information as a feedback for the decision of target toggle number made in 702. Optionally, in some embodiments, the controller 416 may be configured to calculate/monitor the output data toggle number or toggle adjustable range for a while, compare them with target toggle number and obtain some information (for example, the maximum, minimum, average, or some other representative value of toggle number error) for feedback, which may be helpful for the adjustment of the target toggle number in 702. If toggle shaping is used, for example, $1^{st}$-order sigma-delta shaping, the controller 416 may be configured to calculate/monitor the error due to toggle limitation and provide some feedback information for the adjustment of target toggle number.

Example Data Processing System

Figure 9:
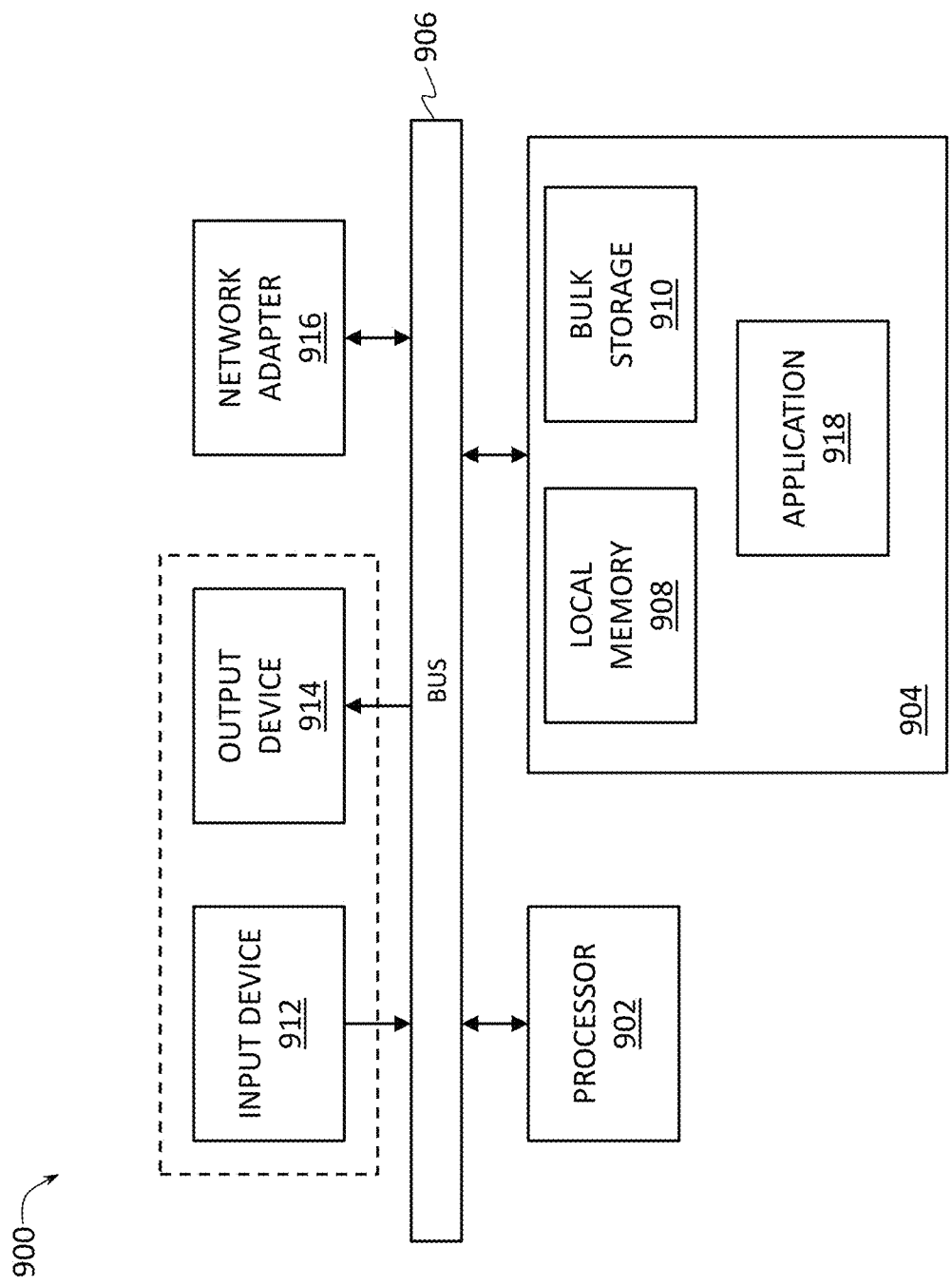
FIG. 9 provides a block diagram illustrating an example data processing system that may be configured to implement, or control, at least portions of performing digital-to-analog conversion with adaptive toggle number compensation using one or more of transparent ISB dither, MSB shuffle, and dummy toggle generation, according to some embodiments of the present disclosure.

FIG. 9 provides a block diagram illustrating an example data processing system 900 that may be configured to implement, or control, at least portions of performing digital-to-analog conversion with adaptive toggle number compensation using one or more of transparent ISB dither, MSB shuffle, and dummy toggle generation, according to some embodiments of the present disclosure.

FIG. 9 provides a block diagram illustrating an example data processing system 900 that may be configured to implement, or control implementations of, at least portions of performing digital-to-analog conversion with adaptive toggle number compensation using one or more of transparent ISB dither, MSB shuffle, and dummy toggle generation as described herein, e.g., in the DAC systems as described with reference to FIGS. 1-7, according to some embodiments of the present disclosure. For example, in some embodiments, the data processing system 900 may implement a control logic configured to control at least portions of implementing the adaptive toggle number compensation techniques as described herein. For example, any of the controllers 116/416 and/or the segmentation units 114/414 may be implemented as, or include, the data processing system 900.

As shown in FIG. 9, the data processing system 900 may include at least one processor 902, e.g. a hardware processor 902, coupled to memory elements 904 through a system bus 906. As such, the data processing system may store program code within memory elements 904. Further, the processor 902 may execute the program code accessed from the memory elements 904 via a system bus 906. In one aspect, the data processing system may be implemented as a computer that is suitable for storing and/or executing program code. It should be appreciated, however, that the data processing system 900 may be implemented in the form of any system including a processor and a memory that is capable of performing the functions described within this disclosure.

In some embodiments, the processor 902 can execute software or an algorithm to perform the activities as discussed in this specification, in particular activities related to implementing adaptive toggle number compensation techniques as described herein. The processor 902 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 902 may be communicatively coupled to the memory element 904, for example in a direct-memory access (DMA) configuration, so that the processor 902 may read from or write to the memory elements 904.

In general, the memory elements 904 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 900 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 1 and 4, can also include suitable interfaces for receiving, transmitting, and/or otherwise communicating data or information in a network environment so that they can communicate with, e.g., the data processing system 900 of another one of these elements.

In certain example implementations, mechanisms for implementing adaptive toggle number compensation techniques as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 904 shown in FIG. 9, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 902 shown in FIG. 9, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 904 may include one or more physical memory devices such as, for example, local memory 908 and one or more bulk storage devices 910. The local memory may refer to RAM or other non-persistent memory device(s) generally used during actual execution of the program code. A bulk storage device may be implemented as a hard drive or other persistent data storage device. The processing system 900 may also include one or more cache memories (not shown) that provide temporary storage of at least some program code in order to reduce the number of times program code must be retrieved from the bulk storage device 910 during execution.

As shown in FIG. 9, the memory elements 904 may store an application 918. In various embodiments, the application 918 may be stored in the local memory 908, the one or more bulk storage devices 910, or apart from the local memory and the bulk storage devices. It should be appreciated that the data processing system 900 may further execute an operating system (not shown in FIG. 9) that can facilitate execution of the application 918. The application 918, being implemented in the form of executable program code, can be executed by the data processing system 900, e.g., by the processor 902. Responsive to executing the application, the data processing system 900 may be configured to perform one or more operations or method steps described herein.

Input/output (I/O) devices depicted as an input device 912 and an output device 914, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 914 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 914. Input and/or output devices 912, 914 may be coupled to the data processing system either directly or through intervening I/O controllers.

In an embodiment, the input and the output devices may be implemented as a combined input/output device (illustrated in FIG. 9 with a dashed line surrounding the input device 912 and the output device 914). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 916 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 900, and a data transmitter for transmitting data from the data processing system 900 to said systems, devices and/or networks. Modems, cable modems, and Ethernet cards are examples of different types of network adapter that may be used with the data processing system 900.

SELECT EXAMPLES

The following paragraphs provide examples of various ones of the embodiments disclosed herein.

Example 1 provides a DAC system that includes a first plurality of DAC units (e.g., the ISB DAC units as described herein), a second plurality of DAC units (e.g., the dither DAC units as described herein), and a controller (e.g., being a part of the segmentation unit as described herein). Each DAC unit of the first plurality of DAC units and the second plurality of DAC units is configured to operate in one of two states to convert multi-bit digital samples to analog values and to produce a first output when operating in a first state and produce a second output, different from the first output, when operating in a second state. The controller is configured to select one or more DAC units of the first plurality of DAC units and the second plurality of DAC units to operate in a first state of the two states during conversion of a second multi-bit digital sample to a second analog value, operate the selected one or more DAC units in the first state during conversion of the second digital sample, and operate unselected DAC units of the first plurality of DAC units and the second plurality of DAC units in a second state of the two states during conversion of the second digital sample. The one or more DAC units are selected so that a number of DAC units of the first plurality of DAC units and the second plurality of DAC units that switch from operating in the first state during conversion of a first multi-bit digital sample to a first analog value to operating in the second state during conversion of the second digital sample and that switch from operating in the second state during conversion of the first digital sample to operating in the first state during conversion of the second digital sample is equal to a target toggle number, where the first digital sample and the second digital sample are consecutive digital samples of an input signal to the DAC system (i.e., the first digital sample is a digital sample of an input signal to the DAC that immediately precedes the second digital sample).

Example 2 provides the DAC system according to example 1, where the first plurality of DAC units is thermometer-coded and the second plurality of DAC units is binary-coded.

Example 3 provides the DAC system according to example 1, where the first digital sample is an ISB portion of a first digital input value of an input signal to the DAC and the second digital sample is an ISB portion of a second digital input value of the input signal to the DAC.

Example 4 provides the DAC system according to example 3, where the DAC further includes a third plurality of DAC units configured to convert MSB portions of the first digital input value and the second digital input value.

Example 5 provides the DAC system according to example 4, where each of the first plurality of DAC units and the third plurality of DAC units is thermometer-coded, at least some of the second plurality of DAC units are binary-coded, and a coding weight of the MSB DAC unit (i.e., the DAC unit, of the second plurality of DAC units, that has the greatest weight) of the second plurality of DAC units is equal to a coding weight of one (any) DAC unit of the third plurality of DAC units.

Example 6 provides the DAC system according to examples 4 or 5, where the controller is further configured to select one or more DAC units of the third plurality of DAC units to operate in the first state during conversion of the MSB portion of the second digital input value, operate the selected one or more DAC units of the third plurality of DAC units in the first state during conversion of the MSB portion of the second digital input value, and operate unselected DAC units of the third plurality of DAC units in the second state during conversion of the MSB portion of the second digital input value. In such an example, the one or more DAC units of the third plurality of DAC units are selected so that a number of DAC units of the third plurality of DAC units that switch from operating in the first state during conversion of the MSB portion of the first digital input value to operating in the second state during conversion of the MSB portion of the second digital input value and that switch from operating in the second state during conversion of the MSB portion of the first digital input value to operating in the first state during conversion of the MSB portion of the second digital input value is equal to a second target toggle number.

Example 7 provides the DAC system according to example 6, where the controller is configured to set the target toggle number and the second target toggle number so that a sum of the target toggle number and the second target toggle number is equal to a target total toggle number.

Example 8 provides the DAC system according to any one of the preceding examples, further including an adder configured to add outputs of the first plurality of DAC units and outputs of the second plurality of DAC units generated by operating the one or more selected DAC units and the unselected DAC unit during conversion of the first digital sample (i.e., resulting from operation of the first plurality of DAC units and the second plurality of DAC units to convert the first digital sample) to generate an analog value indicative of the first analog value, and add outputs of the first plurality of DAC units and outputs of the second plurality of DAC units generated by operating the one or more selected DAC units and the unselected DAC unit during conversion of the second digital sample (i.e., resulting from operation of the first plurality of DAC units and the second plurality of DAC units to convert the second digital sample) to generate an analog value indicative of the second analog value.

Example 9 provides the DAC system according to any one of the preceding examples, where the controller is configured to select the one or more DAC units so that the number of DAC units of the first plurality of DAC units and the second plurality of DAC units that switch from operating in the first state during conversion of the first digital sample to operating in the second state during conversion of the second digital sample and that switch from operating in the second state during conversion of the first digital sample to operating in the first state during conversion of the second digital sample is equal to the target toggle number for each pair of consecutive digital samples of the input signal.

Example 10 provides the DAC system according to any one of the preceding examples, where the controller is configured to select the one or more DAC units by providing a first control signal to the one or more DAC units and by providing a second control signal, different from the first control signal, to the unselected DAC units.

Example 11 provides the DAC system according to example 10, where one control signal of the first control signal and the second control signal includes a bit of 1 (or a high logic state) and another control signal of the first control signal and the second control signal includes a bit of 0 (or a low logic state).

Example 12 provides a DAC system that includes a plurality of DAC units (e.g., MSB DAC units as described herein) and a controller (e.g., being a part of the segmentation unit as described herein). Each DAC unit of the plurality of DAC units is configured to operate in one of two states to convert multi-bit digital samples to analog values and to produce a first output when operating in a first state and produce a second output, different from the first output, when operating in a second state. The controller is configured to select one or more DAC units of the plurality of DAC units to operate in a first state of the two states during conversion of a second multi-bit digital sample to a second analog value, operate the selected one or more DAC units in the first state during conversion of the second digital sample, and operate unselected DAC units of the plurality of DAC units in a second state of the two states during conversion of the second digital sample. The one or more DAC units are selected so that a number of DAC units of the plurality of DAC units that switch from operating in the first state during conversion of a first multi-bit digital sample to a first analog value to operating in the second state during conversion of the second digital sample and that switch from operating in the second state during conversion of the first digital sample to operating in the first state during conversion of the second digital sample is equal to a target toggle number, where the first digital sample and the second digital sample are consecutive digital samples of an input signal to the DAC system (i.e., the first digital sample is a digital sample of an input signal to the DAC that immediately precedes the second digital sample).

Example 13 provides the DAC system according to example 12, where the plurality of DAC units is thermometer-coded.

Example 14 provides the DAC system according to examples 12 or 13, where the first digital sample is a MSB portion of a first digital input value of an input signal to the DAC and the second digital sample is an MSB portion of a second digital input value of the input signal to the DAC.

Example 15 provides the DAC system according to any one of examples 12-14, where the controller is configured to select the one or more DAC units so that the number of DAC units of the plurality of DAC units that switch from operating in the first state during conversion of the first digital sample to operating in the second state during conversion of the second digital sample and that switch from operating in the second state during conversion of the first digital sample to operating in the first state during conversion of the second digital sample is equal to the target toggle number for each pair of consecutive digital samples of the input signal.

Example 16 provides a DAC system that includes a plurality of MSB DAC units (e.g., the MSB DAC units as described herein), a plurality of ISB DAC units (e.g., the ISB DAC units as described herein), a plurality of LSB DAC units (e.g., the LSB DAC units as described herein), a plurality of dither DAC units (e.g., the dither DAC units as described herein), and a controller (e.g., being a part of the segmentation unit as described herein). The MSB DAC units are configured to operate in one of two states to convert multi-bit MSB portions of digital values of an input signal to the DAC system to first analog values and to produce a first output when operating in a first state and produce a second output, different from the first output, when operating in a second state. The ISB DAC units are configured to operate in the one of two states to convert multi-bit ISB portions of the digital values to second analog values and to produce a first output when operating in a first state and produce a second output, different from the first output, when operating in a second state. The LSB DAC units are configured to operate in the one of two states to convert multi-bit LSB portions of the digital values to second analog values and to produce a first output when operating in a first state and produce a second output, different from the first output, when operating in a second state. The dither DAC units are configured to operate in the one of two states. The controller is configured to select one or more DAC units of the plurality of ISB DAC units and the plurality of dither DAC units to operate in a first state of the two states to convert an ISB portion of a second digital value, operate the selected one or more DAC units in the first state during conversion of the ISB portion of the second digital value, and operate unselected DAC units of the plurality of ISB DAC units and the plurality of dither DAC units in a second state of the two states during conversion of the ISB portion of the second digital value. The one or more DAC units are selected so that a number of DAC units of the plurality of ISB DAC units and the plurality of dither DAC units that switch from operating in the first state during conversion of an ISB portion of a first digital value to operating in the second state during conversion of the ISB portion of the second digital value and that switch from operating in the second state during conversion of the ISB portion of the first digital value to operating in the first state during conversion of the ISB portion of the second digital value is equal to a target toggle number, where the first digital value and the second digital value are consecutive digital values of an input signal to the DAC system (i.e., the first digital value is a digital value of an input signal to the DAC system that immediately precedes the second digital value).

Example 17 provides the DAC system according to example 16, where each of the plurality of MSB DAC units and the plurality of ISB DAC units is thermometer-coded, and each of the plurality of LSB DAC units and the dither DAC units is binary-coded.

Example 18 provides the DAC system according to examples 16 or 17, where the controller is further configured to select one or more DAC units of the plurality of MSB DAC units to operate in the first state during conversion of the MSB portion of the second digital value, operate the selected one or more DAC units of the plurality of MSB DAC units in the first state during conversion of the MSB portion of the second digital value, and operate unselected DAC units of the plurality of MSB DAC units in the second state during conversion of the MSB portion of the second digital value. The one or more DAC units of the plurality of MSB DAC units are selected so that a number of DAC units of the plurality of MSB DAC units that switch from operating in the first state during conversion of the MSB portion of the first digital value to operating in the second state during conversion of the MSB portion of the second digital value and that switch from operating in the second state during conversion of the MSB portion of the first digital value to operating in the first state during conversion of the MSB portion of the second digital value is equal to a second target toggle number.

Example 19 provides the DAC system according to example 18, where the controller is configured to set the target toggle number and the second target toggle number so that a sum of the target toggle number and the second target toggle number is equal to a target total toggle number.

Example 20 provides the DAC system according to any one of examples 16-19, further including an adder configured to add outputs of the plurality of MSB DAC units, outputs of the plurality of ISB DAC units, outputs of the plurality of LSB DAC units, and outputs of the plurality of dither DAC units generated during conversion of the first digital value to generate an analog version of the first digital value, and add outputs of the plurality of MSB DAC units, outputs of the plurality of ISB DAC units, outputs of the plurality of LSB DAC units, and outputs of the plurality of dither DAC units generated during conversion of the second digital value to generate an analog version of the second digital value.

Variations and Implementations

While embodiments of the present disclosure were described above with references to example implementations as shown in figures, a person skilled in the art will realize that the various teachings described above are applicable to a large variety of other implementations. For example, while some descriptions provided in the present disclosure refer to thermometer or binary coding, these descriptions are equally applicable to other coding methods used in DACs. In another example, adaptive toggle number compensation with transparent ISB dither described above is equally applicable to bits other than ISBs (e.g., applicable to any plurality of consecutive bits of a given digital sample to be converted, not only for the ISBs). Similarly, adaptive toggle number compensation with MSB shuffle described above is equally applicable to bits other than MSBs (e.g., applicable to any plurality of consecutive bits of a given digital sample to be converted, not only for the MSBs).

In various embodiments, adaptive toggle number compensation techniques as described herein may be implemented in different DAC architectures, with different DAC segmentation schemes, or in DACs that are not segmented. In various embodiments, adaptive toggle number compensation techniques as described herein are not limited to current-steering DACs (Nyquist DACs) as they are equally applicable, possibly with modifications that would be apparent to a person of ordinary skill in the art, to other types of DACs, such as oversampling DACs.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the adaptive toggle number compensation techniques discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to improved dummy signal generation techniques.

Parts of various systems for implementing adaptive toggle number compensation techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure implementing adaptive toggle number compensation techniques described herein may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate.

Other embodiments may include a multi-chip-module (MCM), with a plurality of separate ICs located within a single electronic package and configured to interact closely with each other through the electronic package. In various other embodiments, the functionalities of adaptive toggle number compensation techniques proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to adaptive toggle number compensation techniques as proposed herein illustrate only some of the possible functions that may be executed by, or within, systems illustrated in figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the apparatus described above may also be implemented with respect to the method or process described herein and specifics in the examples may be used anywhere in one or more embodiments.

The invention claimed is:

1. A digital-to-analog converter (DAC) system, comprising:
a first plurality of DAC units;
a second plurality of DAC units, where each DAC unit of the first plurality of DAC units and the second plurality of DAC units is configured to operate in one of two states to convert digital samples to analog values; and
a controller configured to:
select one or more DAC units of the first plurality of DAC units and the second plurality of DAC units to operate in a first state of the two states during conversion of a second digital sample to a second analog value,
operate the one or more DAC units in the first state during conversion of the second digital sample, and
operate unselected DAC units of the first plurality of DAC units and the second plurality of DAC units in a second state of the two states during conversion of the second digital sample;
wherein the one or more DAC units are selected so that a number of DAC units of the first plurality of DAC units and the second plurality of DAC units that switch from operating in the first state during conversion of a first digital sample to a first analog value to operating in the second state during conversion of the second digital sample and that switch from operating in the second state during conversion of the first digital sample to operating in the first state during conversion of the second digital sample is equal to a target toggle number, where the first digital sample and the second digital sample are consecutive digital samples of an input signal to the DAC system.

2. The DAC system according to claim 1, wherein the first plurality of DAC units is thermometer-coded and the second plurality of DAC units is binary-coded.

3. The DAC system according to claim 1, wherein the first digital sample is an intermediate significant bit (ISB) portion of a first digital input value and the second digital sample is an ISB portion of a second digital input value.

4. The DAC system according to claim 3, wherein the DAC further includes a third plurality of DAC units configured to convert most significant bit (MSB) portions of the first digital input value and the second digital input value.

5. The DAC system according to claim 4, wherein:
each of the first plurality of DAC units and the third plurality of DAC units is thermometer-coded,
at least some of the second plurality of DAC units are binary-coded, and
a coding weight of the MSB DAC unit of the second plurality of DAC units is equal to a coding weight of one DAC unit of the third plurality of DAC units.

6. The DAC system according to claim 4, wherein the controller is further configured to:

select one or more DAC units of the third plurality of DAC units to operate in the first state during conversion of the MSB portion of the second digital input value,
operate the one or more DAC units of the third plurality of DAC units in the first state during conversion of the MSB portion of the second digital input value, and
operate unselected DAC units of the third plurality of DAC units in the second state during conversion of the MSB portion of the second digital input value,
wherein the one or more DAC units of the third plurality of DAC units are selected so that a number of DAC units of the third plurality of DAC units that switch from operating in the first state during conversion of the MSB portion of the first digital input value to operating in the second state during conversion of the MSB portion of the second digital input value and that switch from operating in the second state during conversion of the MSB portion of the first digital input value to operating in the first state during conversion of the MSB portion of the second digital input value is equal to a second target toggle number.

7. The DAC system according to claim 6, wherein the controller is configured to set the target toggle number and the second target toggle number so that a sum of the target toggle number and the second target toggle number is equal to a target total toggle number.

8. The DAC system according to claim 1, further comprising an adder configured to:
add outputs of the first plurality of DAC units and outputs of the second plurality of DAC units generated by operating the one or more selected DAC units and the unselected DAC unit during conversion of the first digital sample to generate an analog value indicative of the first analog value, and
add outputs of the first plurality of DAC units and outputs of the second plurality of DAC units generated by operating the one or more selected DAC units and the unselected DAC unit during conversion of the second digital sample to generate an analog value indicative of the second analog value.

9. The DAC system according to claim 1, wherein the controller is configured to select the one or more DAC units so that the number of DAC units of the first plurality of DAC units and the second plurality of DAC units that switch from operating in the first state during conversion of the first digital sample to operating in the second state during conversion of the second digital sample and that switch from operating in the second state during conversion of the first digital sample to operating in the first state during conversion of the second digital sample is equal to the target toggle number for each pair of consecutive digital samples of the input signal.

10. The DAC system according to claim 1, wherein the controller is configured to select the one or more DAC units by providing a first control signal to the one or more DAC units and by providing a second control signal, different from the first control signal, to the unselected DAC units.

11. The DAC system according to claim 10, wherein one control signal of the first control signal and the second control signal includes a first logic state and another control signal of the first control signal and the second control signal includes a second logic state.

12. A digital-to-analog converter (DAC) system, comprising:

a plurality of DAC units, where each DAC unit of the plurality of DAC units is configured to operate in one of two states to convert digital samples to analog values; and a controller configured to:
select one or more DAC units of the plurality of DAC units to operate in a first state of the two states during conversion of a second digital sample to a second analog value,
operate the selected one or more DAC units in the first state during conversion of the second digital sample, and
operate unselected DAC units of the plurality of DAC units in a second state of the two states during conversion of the second digital sample;

wherein the one or more DAC units are selected so that a number of DAC units of the plurality of DAC units that switch from operating in the first state during conversion of a first multi-bit digital sample to a first analog value to operating in the second state during conversion of the second digital sample and that switch from operating in the second state during conversion of the first digital sample to operating in the first state during conversion of the second digital sample is equal to a target toggle number, where the first digital sample and the second digital sample are consecutive digital samples of an input signal to the DAC system.

13. The DAC system according to claim 12, wherein the plurality of DAC units is thermometer-coded.

14. The DAC system according to claim 12, wherein the first digital sample is a most significant bit (MSB) portion of a first digital input value and the second digital sample is an MSB portion of a second digital input value.

15. The DAC system according to claim 12, wherein the controller is configured to select the one or more DAC units so that the number of DAC units of the plurality of DAC units that switch from operating in the first state during conversion of the first digital sample to operating in the second state during conversion of the second digital sample and that switch from operating in the second state during conversion of the first digital sample to operating in the first state during conversion of the second digital sample is equal to the target toggle number for each pair of consecutive digital samples of the input signal.

16. A digital-to-analog converter (DAC) system, comprising:
a plurality of most significant bit (MSB) DAC units configured to operate in one of two states to convert MSB portions of digital values of an input signal to the DAC system to first analog values;
a plurality of intermediate significant bit (ISB) DAC units configured to operate in the one of two states to convert ISB portions of the digital values to second analog values;
a plurality of least significant bit (LSB) DAC units configured to operate in the one of two states to convert LSB portions of the digital values to second analog values;
a plurality of dither DAC units configured to operate in the one of two states; and
a controller configured to:
select one or more DAC units of the plurality of ISB DAC units and the plurality of dither DAC units to operate in a first state of the two states to convert an ISB portion of a second digital value,
operate the one or more DAC units in the first state during conversion of the ISB portion of the second digital value, and
operate unselected DAC units of the plurality of ISB DAC units and the plurality of dither DAC units in a second state of the two states during conversion of the ISB portion of the second digital value;

wherein the one or more DAC units are selected so that a number of DAC units of the plurality of ISB DAC units and the plurality of dither DAC units that switch from operating in the first state during conversion of an ISB portion of a first digital value to operating in the second state during conversion of the ISB portion of the second digital value and that switch from operating in the second state during conversion of the ISB portion of the first digital value to operating in the first state during conversion of the ISB portion of the second digital value is equal to a target toggle number, where the first digital value and the second digital value are consecutive digital values of an input signal to the DAC system.

17. The DAC system according to claim 16, wherein:
each of the plurality of MSB DAC units and the plurality of ISB DAC units is thermometer-coded, and
each of the plurality of LSB DAC units and the dither DAC units is binary-coded.

18. The DAC system according to claim 16, wherein the controller is further configured to:
select one or more DAC units of the plurality of MSB DAC units to operate in the first state during conversion of the MSB portion of the second digital value,
operate the one or more DAC units of the plurality of MSB DAC units in the first state during conversion of the MSB portion of the second digital value, and
operate unselected DAC units of the plurality of MSB DAC units in the second state during conversion of the MSB portion of the second digital value,
wherein the one or more DAC units of the plurality of MSB DAC units are selected so that a number of DAC units of the plurality of MSB DAC units that switch from operating in the first state during conversion of the MSB portion of the first digital value to operating in the second state during conversion of the MSB portion of the second digital value and that switch from operating in the second state during conversion of the MSB portion of the first digital value to operating in the first state during conversion of the MSB portion of the second digital value is equal to a second target toggle number.

19. The DAC system according to claim 18, wherein the controller is configured to set the target toggle number and the second target toggle number so that a sum of the target toggle number and the second target toggle number is equal to a target total toggle number.

20. The DAC system according to claim 16, further comprising an adder configured to:
add outputs of the plurality of MSB DAC units, outputs of the plurality of ISB DAC units, outputs of the plurality of LSB DAC units, and outputs of the plurality of dither DAC units generated during conversion of the first digital value to generate an analog version of the first digital value, and
add outputs of the plurality of MSB DAC units, outputs of the plurality of ISB DAC units, outputs of the plurality of LSB DAC units, and outputs of the plurality of dither DAC units generated during conversion of the second digital value to generate an analog version of the second digital value.

\* \* \* \* \*